(12) United States Patent  (10) Patent No.: US 8,503,687 B2
Hoshuyama  (45) Date of Patent: Aug. 6, 2013

(54) SYSTEM IDENTIFICATION DEVICE AND SYSTEM IDENTIFICATION METHOD

(75) Inventor: Osamu Hoshuyama, Tokyo (JP)

(73) Assignee: NEC Corporation, Tokyo (JP)

( * ) Notice: Subject to any disclaimer, the term of this patent is extended or adjusted under 35 U.S.C. 154(b) by 543 days.

(21) Appl. No.: 12/679,217

(22) PCT Filed: Sep. 19, 2008

(86) PCT No.: PCT/JP2008/066997
§ 371 (c)(1),
(2), (4) Date: May 25, 2010

(87) PCT Pub. No.: WO2009/038182
PCT Pub. Date: Mar. 26, 2009

(65) Prior Publication Data
US 2010/0260352 A1  Oct. 14, 2010

(30) Foreign Application Priority Data

Sep. 20, 2007  (JP) .................................. 2007-243329

(51) Int. Cl.
A61F 11/06 (2006.01)
H04B 15/00 (2006.01)

(52) U.S. Cl.
USPC ...................................... 381/71.11; 381/94.1

(58) Field of Classification Search
USPC .............. 381/94.1, 94.2, 94.3, 93, 71.1–71.9, 381/71.11, 71.12, 71.14; 379/406.01–406.16; 455/570
See application file for complete search history.

(56) References Cited

U.S. PATENT DOCUMENTS 5,535,149 A  7/1996 Mori et al.
5,633,636 A  5/1997 Reyhani
7,773,742 B2* 8/2010 Takada ..................... 379/406.08
8,045,730 B1* 10/2011 Fozunbal et al. ............... 381/93
2006/0251261 A1* 11/2006 Christoph ......................... 381/1
2007/0071253 A1* 3/2007 Sato et al. .................... 381/94.3

FOREIGN PATENT DOCUMENTS

| JP | 56-35052 B2 | 8/1981 |
| JP | 4-271623 A | 9/1992 |
| JP | 7-176991 A | 7/1995 |
| JP | 8-274690 A | 10/1996 |
| JP | 3187716 B2 | 5/2001 |

OTHER PUBLICATIONS

Osamu Hoshuyama et al., A Variable Step Size Adaptive Filter Algorithm Based on a Slave Filter Incorporating Averaged Coefficients, Proceedings of the 1994 IEICE Spring Conference, The Institute of Electronics Information and Communication Engineers, 1994, p. 1-172.

\* cited by examiner

Primary Examiner — Xu Mei
Assistant Examiner — David Ton
(74) Attorney, Agent, or Firm — Foley & Lardner LLP

(57) ABSTRACT

The system identifying device preferably includes adaptive and dependent filters which receive a signal supplied through a first input terminal, a dependent filter factor updating unit for updating the filter factor of the dependent filter according to the filter factor of the adaptive filter, a first subtracter for subtracting the output signal outputted from the adaptive filter from the signal supplied through a second input terminal, a first output error mean computing section for computing a first output error mean from the output signal outputted from the first subtracter, a second subtracter for subtracting the output signal outputted from the dependent filter from the signal supplied through the second input terminal, a second output error mean computing section for computing a second output error mean from the output signal outputted from the second subtracter, and a compactor for comparing the first and second output error means.

12 Claims, 19 Drawing Sheets

SYSTEM IDENTIFICATION DEVICE AND SYSTEM IDENTIFICATION METHOD

This application is the National Phase of PCT/JP2008/066997,, filed Sept. 19, 2008,, which claims priority to Japanese Application No. 2007-243329,, filed Sept. 20, 2007,, the disclosures of which are hereby incorporated by reference in their entirety.

TECHNICAL FIELD

The present invention relates to a system identification device for identifying an unidentified system and a system identification method.

BACKGROUND ART

An echo canceller, a noise canceller, a howling canceller and an adaptive equalizer are known as application examples of an adaptive filter for identifying an unidentified system. Here, using the echo canceller for removing an echo leaking from a speaker to a microphone during hands-free communication as an example, techniques related to the system identification device and the system identification method will be described.

FIG. 12 is a diagram showing a configuration of the echo canceller. A voice from a far-end is inputted to a terminal 5 and is reproduced by a speaker 1. The reproduced far-end voice leaks into a microphone 2 as an echo via an echo path such as a space. A near-end voice in addition to the echo is supplied to the microphone 2.

The echo canceller 3 operates to suppress the echo of the voice leaking into the microphone 2 through an amplifier, the speaker 1 and the like, by generating a pseudo echo (echo replica) corresponding a transmission signal by using an adaptive filter for performing system identification of an impulse response length of the echo path. At this time, each filter factor of the adaptive filter is modified and estimated, by correlating an error signal, which is obtained by subtracting the echo replica from a signal having both of the echo and a reception signal, with the transmission signal. The near-end voice with suppressed echo is obtained by the error signal and is sent from a terminal a to the far end. As representative filter factor modification algorithm/adaptive, algorithm in the adaptive filter, an LMS algorithm, a learning identification method, an RLS algorithm and an affine projection algorithm are known.

However, in fact, since an observation noise such as voice and noise at the near end in addition to the echo are mixed in the microphone 2, an error occurs in modification and estimation of each filter factor of the adaptive filter. This error in the filter factor causes deterioration of an echo suppression performance.

Thus, Japanese Patent No. 3187716, (document 1) proposes a system identification method for reducing the error in modification and estimation of the filter factor of an adaptive filter.

Referring to FIG. 13, a technique described in document 1, (hereinafter referred to as a first related technique) includes two filters of an adaptive filter 20 and a dependent filter 40, a filter factor copy control part 31 for copying a filter factor of the adaptive filter 20 to the dependent filter 40, a subtracter 50 for subtracting an output of the adaptive filter 20 from a desired signal applied to a terminal 12, an output error average calculation part 80 for calculating a time average value of an output of the subtracter 50, a subtracter 60 for subtracting an output of the dependent filter 40 from the desired signal applied to a terminal 12, an output error average calculation part 81 for calculating a time average value of an output of the subtracter 60 and a comparator 82 for comparing the outputs of the two output error average calculation parts 81 and outputting a comparison result to the adaptive filter 20 and the filter factor copy control part 31, and a step size of the adaptive filter 20 and propriety of copying by the filter factor copy control part 31 are controlled based on the comparison result of the comparator 82. Specific operations are as follows.

A far-end signal inputted from a terminal 10 is sent to the adaptive filter 20 and the dependent filter 40. The adaptive filter 20 performs convolution of the far-end signal received from the terminal 10 and a tap factor of the filter and sends a convolution result to the subtracter 50. A group of filter factors is sent to the filter factor copy control part 31. The group of filter factors is modified and updated by an internal adaptive algorithm on basis of an output error outputted from the subtracter 50 and the comparison result of the comparator 82.

The filter factor copy control part 31 receives the group of filter factors from the adaptive filter 20 and the comparison result from the comparator 82, determines whether or not the group of filter factors is copied on the basis of the comparison result, and sends the group of filter factors to the dependent filter 40 when the group of filter factors is determined to be copied.

The dependent filter 40 performs convolution of an input signal received from the terminal 10 into the group of filter factors received from the filter factor copy control part 31 and sends a convolution result to the subtracter 60.

The subtracter 50 subtracts an output signal from the adaptive filter 20 from the desired signal received from the terminal 12 (the signal from the microphone 2 in FIG. 12) and sends a subtraction result to the adaptive filter 20 and the output error average calculation part 80 as an output error signal. The subtracter 60 subtracts an output signal from the dependent filter 40 from the desired signal received from the terminal 12 and sends a subtraction result to an output terminal 14 and the output error average calculation part 81 as an output error signal.

The output error average calculation part 80 calculates an indicator representing magnitude of the error, such as electric power and time average in absolute value of the inputted output error (electric power in patent document 1) and sends the indicator to the comparator 82, The output error average calculation part 81 performs the similar operations to those of the output error average calculation part 80.

The comparator 82 receives the indicators representing magnitude of the error from the output error average calculation part 80 and the output error average calculation part 81, determines which indicator is large and sends a determination result to the adaptive filter 20 and the filter factor copy control part 31.

The filter factor copy control part 31 receives the determination result from the comparator 82, determines that the adaptive filter 20 is converging when an output value of the output error average calculation part 80 is smaller than that of the output error average calculation part 81, and copies the filter factor of the adaptive filter 20 to the dependent filter 40. The reason is that, when the output value of the output error average calculation part 80 (that is, an output error average of the adaptive filter 20) is smaller than the output value of the output error average calculation part 81 (that is, an output error average of the dependent filter 40), the filter factor of the adaptive filter 20 is more accurate than the filter factor of the dependent filter 40. Conversely, when the output value of the output error average calculation part 80 is not smaller than that of the output error average calculation part 81, copying is not performed so that the filter factor of the dependent filter 40 with the smaller output error average may not be updated with the filter factor of the adaptive filter 20 with the larger output error average.

The adaptive filter 20 receives the determination result from the comparator 82, increases a step size to increase a conversion speed when the output value of the output error average calculation part 80 is smaller than that of the output error average calculation part 81, and decreases the step size in the other case.

The system described in patent document 1 performs system identification with higher accuracy by using the two filters of the adaptive filter 20 and the dependent filter 40 which uses the filter factor copied from the filter factor of the adaptive filter 20 and appropriately updating the filter factor of the dependent filter 40.

Here, since the adaptive filter 20, the filter factor copy control part 31 and the dependent filter 40 are elements also used in exemplary embodiments of the present invention, configuration examples thereof will be described in detail.

FIG. 14 is a diagram showing the configuration example of the adaptive filter 20. The adaptive filter 20 is broadly configured of a convolution calculation part and an adaptive algorithm part. Here, a case where an M tap FIR filter is used as the filter in the convolution calculation part and the learning identification is used as the adaptive algorithm is shown. An input signal from the terminal 10 in FIG. 13 is inputted through a terminal 201, inverted into a delay signal group with tap by a delayer, generator group 210$m$, (m=1, 2,, . . . , M), and also sent to a power inverse calculation part 221. The delay signal group generated by the delay generator group 210$m$, is sent to a multiplier group 206$m$, and multiplied by the respective filter factors in the group of filter factors modified by the adaptive algorithm, and the sum is calculated by an adder group 211$m$, outputted from a terminal 299 and sent to the subtracter 50 in FIG. 13.

The power inverse calculation part 221 calculates a value obtained by multiplying the power of the input signal by a tap number M or square norm in a case where the delay signal group is interpreted as a vector, and outputs a result obtained by calculating an inverse of the value to a multiplier 223 as an output. The comparison result of the comparator 82 which is inputted through a terminal 202 is converted into the step size by a step size calculation part 222 and multiplied by an output result of the power inverse calculation part 221 by the multiplier 223, and its result is sent to a multiplier 224. The multiplier 224 multiplies the output error from a terminal 203 (which is supplied from the subtracter 50 in FIG. 13) by the output result of the multiplier 223 and sends a result value to a multiplier group 209$m$. The multiplier group 209$m$ receives respective delay signals from the delay generator group 210$m$, multiplies the delay signals by the value supplied from the multiplier 224, and sends obtained values to respective adders in an adder group 208$m$. The adder group 208$m$, receives signals from respective delay generators in a delay generator group 207$m$, and signals from respective multipliers in the multiplier group 209$m$, and calculates and sends the sum of signals to respective delay generator groups in the delay generator group 207$m$. The delay generator group 207$m$, receives signals from the respective adders in the adder group 208$m$, sends signals delayed by 1 sample to the respective adders in the adder group 208$m$, as well as sends the signals as the group of filter factors to the multiplier group 206$m$, for convolution. The group of filter factors is sent to the filter factor copy control part 31 in FIG. 13 through a terminal group 205$m$.

Next, a configuration of the filter factor copy control part 31 in FIG. 13 will be described in detail.

FIG. 15 is a diagram showing the configuration example of the filter factor copy control part 31. The filter factor copy control part 31 receives the group of filter factors supplied from the adaptive filter 20 in FIG. 13 through a terminal group 310$m$, and sends the factors to respective switches in a switch group 313$m$. The determination result of the comparator 82 in FIG. 13 is supplied to the switch group 313$m$, through a terminal 312, The switch group 313$m$, receives the respective group of filter factors from the terminal group 310$m$, and the group of filter factors in the previous sample from a delay generator group 315$m$, and sends either of the groups of filter factors as a new group of filter factors to the dependent filter 40 in FIG. 13 through the delay generator group 315$m$, and a terminal group 319$m$, on the basis of a comparison result sent through the terminal 312. When the comparison result shows that the adaptive filter 20 is converging, the group of filter factors supplied from the terminal group 310$m$, is selected as the new filter factor. This means that the filter factor of the adaptive filter 20 is copied as the filter factor of the dependent filter 40. On the other hand, when the comparison result shows that the adaptive filter 20 has converged and the observation noise becomes dominant, the group of filter factors in the previous sample is selected. This means that the filter factor of the dependent filter 40 is not changed and the filter factor in the previous or earlier sample is used.

A configuration of the dependent filter 40 in FIG. 13 will be described. FIG. 16 is a diagram showing the configuration example, of the dependent filter 40. This configuration is the same as that of the convolution calculation part constituting the adaptive filter 20 described referring to FIG. 14. The input signal in FIG. 13 is inputted through a terminal 410, converted into the delay signal group by a delay generator group 415$m$, and convoluted with the group of filter factors supplied from the filter factor copy control part 31 through a terminal group 411$m$, a multiplier group 413$m$, and an adder group 414$m$, and a convolution result is outputted from a terminal 419.

In the above-mentioned configuration according to the first related technique, when the adaptive filter 20 is converging, the output error of the adaptive filter 20 (that is, the output result of the subtracter 50) is smaller than that of the dependent filter 40 (that is, the output result of the subtracter 60) using the filter factor in the previous or earlier sample, in the output error average. On the other hand, when the adaptive filter 20 has sufficiently converged and the observation noise becomes dominant, the output error of the adaptive filter 20 (that is, the output result of the subtracter 50) is larger than that of the output error of the dependent filter 40 (that is, the output result of the subtracter 60) using the filter factor in the previous or earlier sample, in the output error average. Therefore, the convergence state can be determined based on the determination result of the comparator 82.

By controlling the filter factor copy control part 31 based on the determination result of the convergence state, if the filter factor of the adaptive filter 20 is worse than that of the dependent filter 40, the filter factor of the adaptive filter 20 is hard to be used as the filter factor of the dependent filter 40. Conversely speaking, a desirable filter factor is used Further, for example, by controlling the step size of the adaptive algorithm in the adaptive filter 20 on the basis of the determination result of the convergence state, more desirable control can be performed in the adaptive filter 20. Specifically, according to the desirable control, the possibility that the accuracy of the system identification is wrongly lowered is small. As described above, in the first related technique, more desirable control of the adaptive filter 20 can be achieved, resulting in that system identification with high accuracy can be performed by using the dependent filter 40.

"Variable Step Algorithm Based on Slave Filter Having Averaging Factor", a spring conference by The Institute of Electronics, Information and Communication Engineers, 1994, Speech Collection, p 1-172 (hereinafter referred to as second related technique) proposes a method of comparing output error averages of a plurality of filters at the same time and controlling the adaptive filter, though its configuration is different from that in the first related technique.

FIG. 17 shows a configuration of the second related, technique. The second related technique is different from the first related technique shown in FIG. 13 in that the filter factor copy control part 31 is replaced by a filter factor smoothing part 32 and that the comparison determination result of the comparator 82 is supplied to only the adaptive filter 20. The filter factor smoothing part 32 calculates a value as the filter factor of the dependent filter, by smoothing the group of filter factors received from the adaptive filter 20 in a time direction, that is, time average.

FIG. 18 shows a configuration example of the filter factor smoothing part 32. Here, an example of the case where each filter factor of the adaptive filter 20 is formed by a primary IIR-type low-pass filter (LPF). The group of filter factors of the adaptive filter 20 is supplied through a terminal group 320m, and sent to a corresponding subtracter 321m. The subtracter 321m, subtracts the filter factor in the current sample supplied from a delay generator 325m from the filter factor received through the terminal 320m, and sends the value to a multiplier 323m. The multiplier 323m, multiplies the value received from the subtracter 321m, by a smoothing factor received from a smoothing factor decision part 322 and sends the obtained value to an adder 324m. The adder 324m receives the filter factors in the previous sample supplied from the multiplier 323m, and the delay generator 325m, calculates a sum of the factors and sends the sum to the delay generator 325m, as the filter factor in the next sample. The delay generator 325m, receives the filter factor in the next sample received from the adder 324m, and supplies a value obtained by delaying by one sample as the filter factor in the current sample to the dependent filter 40 through a terminal 329m, as well as to the subtracter 321m, and the adder 324m. A part from the subtracter 321m, to the delay generator 325m constitutes a low-pass filter. A time constant of the low-pass filter, that is, the extent of smoothing, is decided by the smoothing factor decision part 322.

The filter factor of the dependent filter 40 behaves to delay compared to the filter factor of the adaptive filter 20m, with a group delay of the low-pass filter. Furthermore, although the filter factor of the adaptive filter 20 is disturbed by the observation noise, disturbance in the filter factor of the dependent filter 40 obtained through smoothing is small. How this effect is exhibited when the output error averages are compared with each other by the comparator 82 will be described.

When the adaptive filter 20 is converging, the filter factor of the adaptive filter 20 is modified so as to be more desirable, that is, decrease its output error average, while the output error average of the filter factor of the dependent filter 40 becomes larger than that of the filter factor of the adaptive filter 20 due to the delayed behavior. On the other hand, when the adaptive filter 20 has almost converged and the observation noise becomes dominant in the output error, the filter factor of the adaptive filter 20 is disturbed by the observation noise, while disturbance of the filter factor of the dependent filter 40 is smaller due to smoothing. As a result, the output error average of the adaptive filter 20 (the output of the output error average calculation part 80) becomes smaller than the output error average of the dependent filter 40 (the output of the output error average calculation part 81). The convergence state of the adaptive filter 20 can be determined based on this. By controlling the step size of the adaptive filter 20 on the basis of the determination result of the convergence state, the output error of the adaptive filter 20 can be further decreased. Specifically, by increasing the step size to increase the conversion speed when the adaptive filter 20 is converging, and decreasing the step size when the adaptive filter 20 has converged, an effect of the observation noise can be relieved.

As a result, system identification with high accuracy can be achieved in the adaptive filter 20 or the dependent filter 40 in the second related technique.

FIG. 19 shows a generalized example of the above-mentioned first related technique and the second related technique. In FIG. 19, the filter factor copy part 31 in FIG. 13 and the filter factor smoothing part 32 in FIG. 17 are generalized as a dependent filter factor update part 30. By controlling either or both of the step size of the adaptive filter 20 and the dependent filter factor update part 30 on the basis of the result of comparison between the output error average of the adaptive filter 20 and the output error average of the dependent filter 40 (the output of the comparator 82), a signal with reduced output error is obtained through the output terminal 14.

However, when a very large observation noise mixes into the terminal 12, especially when the observation noise includes many low-frequency components such as DC components or when the observation noise is a narrow band signal (for example, a period signal), a false operation that the filter factor of the dependent filter 20 is wrongly updated may occur due to an effect of strong autocorrelation of the observation noise. The reason is as follows. In FIG. 19, when a large observation noise mixes into the terminal 12, first, the output errors of the subtracter 50 and the subtracter 60 tend to increase. However, the adaptive filter 20 updates the filter factor so as to decrease the increased output error, resulting in a decrease in the output error of the subtracter 50, and meanwhile, since updating of the filter factor of the dependent filter 40 is delayed, the output error of the subtracter 60 does not decrease like the output error of the subtracter 50. Thus, the output error average of the adaptive filter 20 becomes smaller than that of the dependent filter 40. For this reason, the step size of the adaptive filter 20 increases and the dependent filter factor update part 30 updates the filter factor of the dependent filter 40 so as to get close to the filter factor of the adaptive filter 20.

When the filter factor of the adaptive filter 20 is modified in the undesirable direction in which the adaptive filter 20 is greatly disturbed by the observation noise due to wrong control of the step size of the adaptive filter 20 and the dependent filter factor update part 30, the accuracy of system identification in the error path is lowered, resulting in that echo in the output signal obtained through the output terminal 14 is not sufficiently removed.

When the observation noise components mixing into the terminal 12 are removed by use of a low-frequency cutoff filter or a band cutoff filter in order to relieve the bad effect of the observation noise, a part of the desired signal supplied through the terminal 12 is simultaneously removed and therefore, system identification of the echo path itself becomes difficult.

DISCLOSURE OF INVENTION

An object of the present invention is to provide a system identification method and a device which solve the above-mentioned problem that accurate system identification cannot be achieved due to the observation noise mixed in a desired signal.

In order to solve the problem, a system identification device for identifying an unidentified system existing between a first input terminal and a second input terminal is configured as follows. Preferably, the system identification device includes: an adaptive filter and a dependent filter which receive a signal supplied from the first input terminal; a dependent filter factor update part configured to update a filter factor of the dependent filter; a first subtracter configured to subtract an output signal of the adaptive filter from a signal supplied from the second input terminal; a first output error average calculation part configured to calculate a first output error average based on an output signal of the first subtracter; a second subtracter configured to subtract an output signal of the dependent filter based on the signal supplied from the second input terminal; a second output error average calculation part configured to calculate a second output error average based on an output signal of the second subtracter; and a comparator configured to compare the first output error average with the second output error average. The first output error average calculation part calculates the first output error average, based on remaining components in frequency bands of the output signal of the first subtracter which are obtained by reducing components in at least a part of a band overlapping a frequency band of an observation noise applied to the second input terminal. The second output error average calculation part calculates the second output error average, based on remaining components in frequency bands of the output signal of the second subtracter which are obtained by reducing components in at least a part of a band which overlaps a frequency band of an observation noise applied to the second input terminal.

At least either updating of the filter factor of the adaptive filter by the output signal of the first subtracter or updating of the filter factor of the dependent filter by the dependent filter factor update part is controlled based on a comparison result of the comparator.

According to the present invention, since components in the observation noise which contribute to a false operation are reduced from the output errors and control is performed based on the comparison result of the reduced output errors, even when the observation noise mixes into the desired signal, system identification can be accurately executed.

BRIEF DESCRIPTION OF DRAWINGS

Objects, effects and features of the above-mentioned invention will be more apparent from description of exemplary embodiments in combination of attached drawings.

BEST MODE FOR CARRYING OUT THE INVENTION

Exemplary embodiments of the present invention will be described referring to drawings. However, the exemplary embodiments do not limit the technical scope of the present invention.

[First Exemplary Embodiment]

Figure 1:
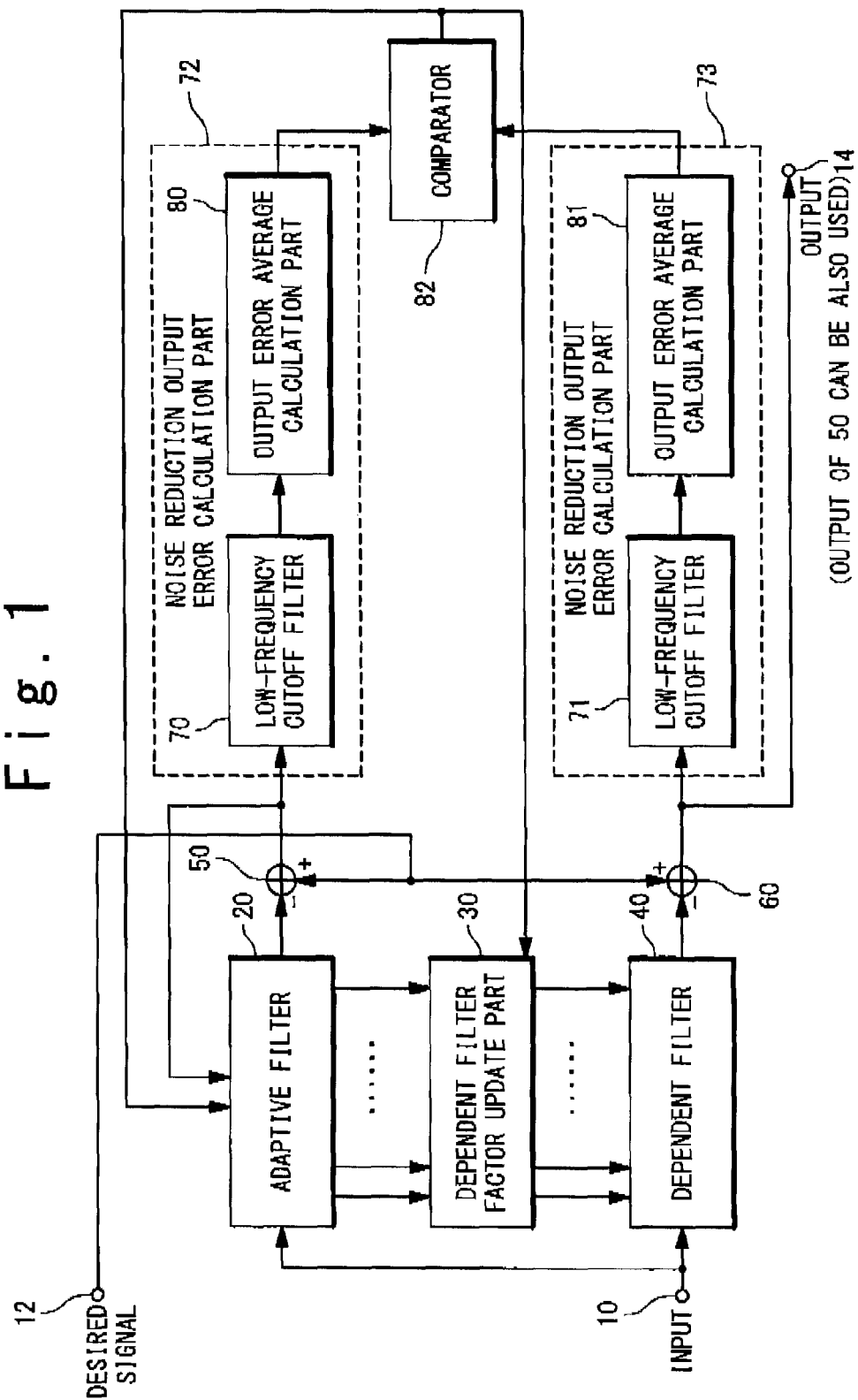
FIG. 1 is a block diagram showing a first exemplary embodiment of the present invention.

FIG. 1 is a block diagram showing a first exemplary embodiment of the present invention. This exemplary embodiment is different from the generalized related technique shown in FIG. 19 in that a low-frequency cutoff filter 70 is inserted into a previous stage of the output error average calculation part 80 and a low-frequency cutoff filter 71 is inserted into a previous stage of the output error average calculation part 81. The low-frequency cutoff filter 70 may be inserted into any place between a branch point, which branches the output of the subtracter 50 to the adaptive filter 20 and the output error average calculation part 80, and the output error average calculation part 80. The low-frequency cutoff filter 71 may be inserted into any place between a branch point, which branches an output of subtracter 60 to the output terminal 14 and the output error average calculation part 81, and the output error average calculation part 81. Here, in a case of hands-free communication by use of a mobile phone and the like, a frequency band of a desired signal is about 300 Hz to 3.4 kHz, and the low-frequency cutoff filters 70, 71 are set so that cutoff bands become 300 Hz to 500 or 1000 Hz. It is desired that the two low-frequency cutoff filters 70, 71 have the substantially same characteristic, Although the output of the subtracter 60 is connected to the output terminal 14 in FIG. 1, the output of the subtracter 50 may be connected to the output terminal 14.

The low-frequency cutoff filter 70 and the output error average calculation part 80 constitute a noise reduction output error calculation part 72 and the low-frequency cutoff filter 71 and the output error average calculation part 81 constitute a noise reduction output error calculation part 73.

The noise reduction output error calculation part 72 removes low-frequency components in the error signal outputted from the subtracter 50 by the low-frequency cutoff filter 70, the output error average calculation part 80 calculates the output error average representing magnitude of the error, such as electric power and time average in absolute value of the output error signal, from remaining components, and the calculated average is sent to the comparator 82. Similarly, the noise reduction output error calculation part 73 removes low-frequency components in the error signal outputted from the subtracter 60 by the low-frequency cutoff filter 71, the output error average calculation part 81 calculates the output error average representing magnitude of the error, such as electric power and time average in absolute value of the output error signal, from remaining components, and the calculated average is sent to the comparator 82.

The comparator 82 receives the output error averages from the output error average calculation part 80 and the output error average calculation part 81, determines magnitude correlation of them and sends a determination result to the adaptive filter 20 and the dependent filter factor update part 30.

The dependent filter factor update part 30 receives the determination result from the comparator 82, and when the output error average calculated by the output error average calculation part 80 is smaller than the output error average calculated by the output error average calculation part 81, determines that the adaptive filter 20 is converging, and updates the filter factor of the dependent filter 40 so as to get close to the filter factor of the adaptive filter 20. Conversely, when the output error average calculated by the output error average calculation part 80 is not smaller than the output error average calculated by the output error average calculation part 81, the dependent filter factor update part 30 does not perform such updating or makes such updating difficult to be performed.

The adaptive filter 20 receives the determination result from the comparator 82, and when the output error average calculated by the output error average calculation part 80 is smaller than the output error average calculated by the output error average calculation part 81, increases the step size to increase the conversion speed and decreases the step size in the other case.

Next, operations and effects of the low-frequency cutoff filters 70, 71 will be described.

First, a case where components in the observation noise are only low-frequency components cut off by the low-frequency cutoff filters 70, 71 will be described.

First, it is assumed that no desired signal exists and only the low-frequency observation noise is inputted to the terminal 12. In this case, both the output errors of the subtracter 50 and the subtracter 60 increase, but the adaptive filter 20 updates the filter factor so as to decrease the increased output error, resulting in that the output error of the subtracter 50 decreases. Meanwhile, since updating of filter factor of the dependent filter 40 is delayed, the output error of the subtracter 60 does not decrease and the state: "output error of the subtracter 50<output error of the subtracter 60" occurs. According to the related technique shown in FIG. 19 without the low-frequency cutoff filters 70, 71, when the state "output error of the subtracter 50<output error of the subtracter 60" occurs, a result: "output error average calculated by the output error average calculation part 80<output error average calculated by the output error average calculation part 81" is directly generated. However, in the present exemplary embodiment, even if the output error of the subtracter 60 increases, since the components in the low-frequency observation noise as a cause of the increase are cut off by the low-frequency cutoff filter 71, the state: "output error of the subtracter 50<output error of the subtracter 60" does not directly generate to the result: "output error average calculated by the output error average calculation part 80<output error average calculated by the output error average calculation part 81". For this reason, the probability that the convergence state of the adaptive filter 20 is wrongly determined due to the effect of the low-frequency observation noise mixed in the terminal 12 can be decreased, and therefore, high-accurate system identification can be achieved.

Next, it is assumed that the desired signal and a signal having low-frequency observation noise are inputted to the terminal 12. Also in this case, both the output errors of the subtracter 50 and the subtracter 60 firstly increase, the adaptive filter 20 updates the filter factor so as to decrease the increased output error, resulting in that the output error of the subtracter 50 decreases, Meanwhile, since updating of filter factor of the dependent filter, 40 is delayed, the output error of the subtracter 60 does not decrease, and the state: "output error of the subtracter 50<output error of the subtracter 60" is generated. However, low-frequency components in the observation noise and low-frequency components in the desired signal among causes of the increase in the output error of the subtracter 60 are cut off by the low-frequency cutoff filter 71, high-frequency components in the desired signal pass through the low-frequency Cutoff filter 71 to be supplied to the output error average calculation part 81, and the result: "output error average calculated by the output error average calculation part 80<output error average calculated by the output error average calculation part 81" is generated. As a result, it is determined that the adaptive filter 20 is converging based on the comparison result of the comparator 82, and then, the step size of the adaptive filter 20 is increased and the filter factor of the dependent filter is updated.

Next, a case where the observation noise contains high-frequency components which are not cut off by the low-frequency cutoff filters 70, 71 will be described.

Since low-frequency components in the observation noise have strong autocorrelation, they contribute heavily to the false operation. However, since high-frequency components have lower autocorrelation than low-frequency components, they are hard to contribute to the false operation unless its level is too high. The reason is as follows.

If the output error of the subtracter 50 increases when only high-frequency observation noise is inputted to the terminal 12, the adaptive filter 20 updates the filter factor so as to decrease the increased output error. If the observation noise contains low-frequency components, the level of the inputted observation noise slowly changes, and the output error of the subtracter 50 gradually decreases. However, in a case where the observation noise is a high-frequency component, since the level of the inputted observation noise changes at the next time, the output error of the subtracter 50 does not necessarily gradually decrease. As a result, the output error average of the subtracter 50 does not necessarily become smaller than the output error average of the subtracter 60. For this reason, the probability that the convergence state of the adaptive filter 20 is wrongly determined due to the effect of the high-frequency observation noise inputted through the terminal 12 becomes smaller compared to the case of the low-frequency observation noise.

On the other hand, when the level of high-frequency components included in the desired signal is sufficiently higher than the level of high-frequency components included in the observation noise, the result: "output error average calculated by the output error average calculation part 80<output error average calculated by the output error average calculation part 81" is obtained due to the existence of the high-frequency components in the desired signal. As a result, since the comparison result of the comparator 82 shows that the adaptive filter 20 is converging, the step size of the adaptive filter 20 is increased and the filter factor of the dependent filter is updated.

In consideration of these matters, in the present exemplary embodiment, in order to reduce only low-frequency components (low-region components) in the observation noise components, which have strong autocorrelation and constitute a major cause of false operation, the low-frequency cutoff filter 70 and the low-frequency cutoff filter 71 are used.

Next, configuration elements of the present exemplary embodiment will be described in detail.

Figure 14:
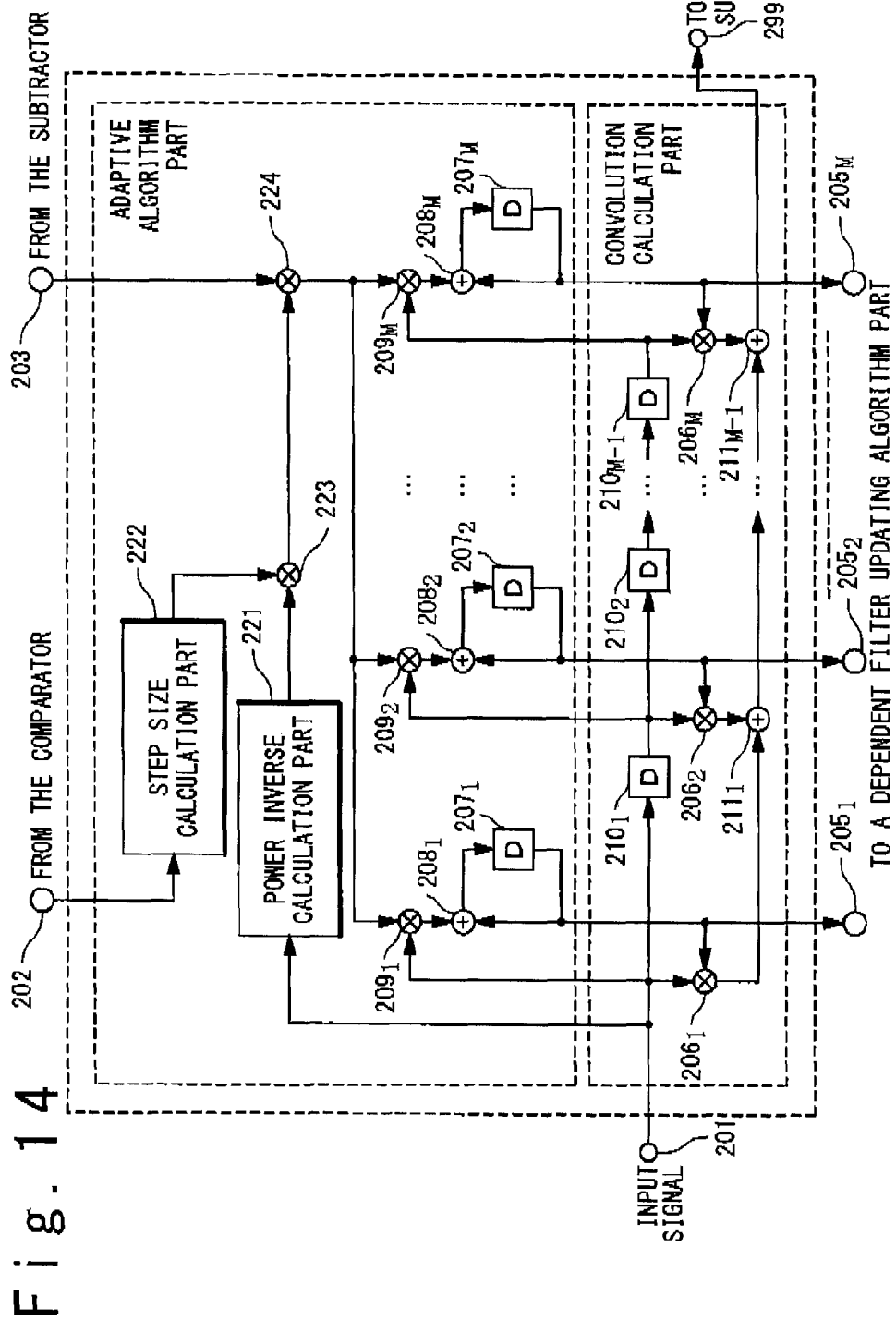
FIG. 14 is a block diagram showing a configuration example of an adaptive filter.
Figure 15:
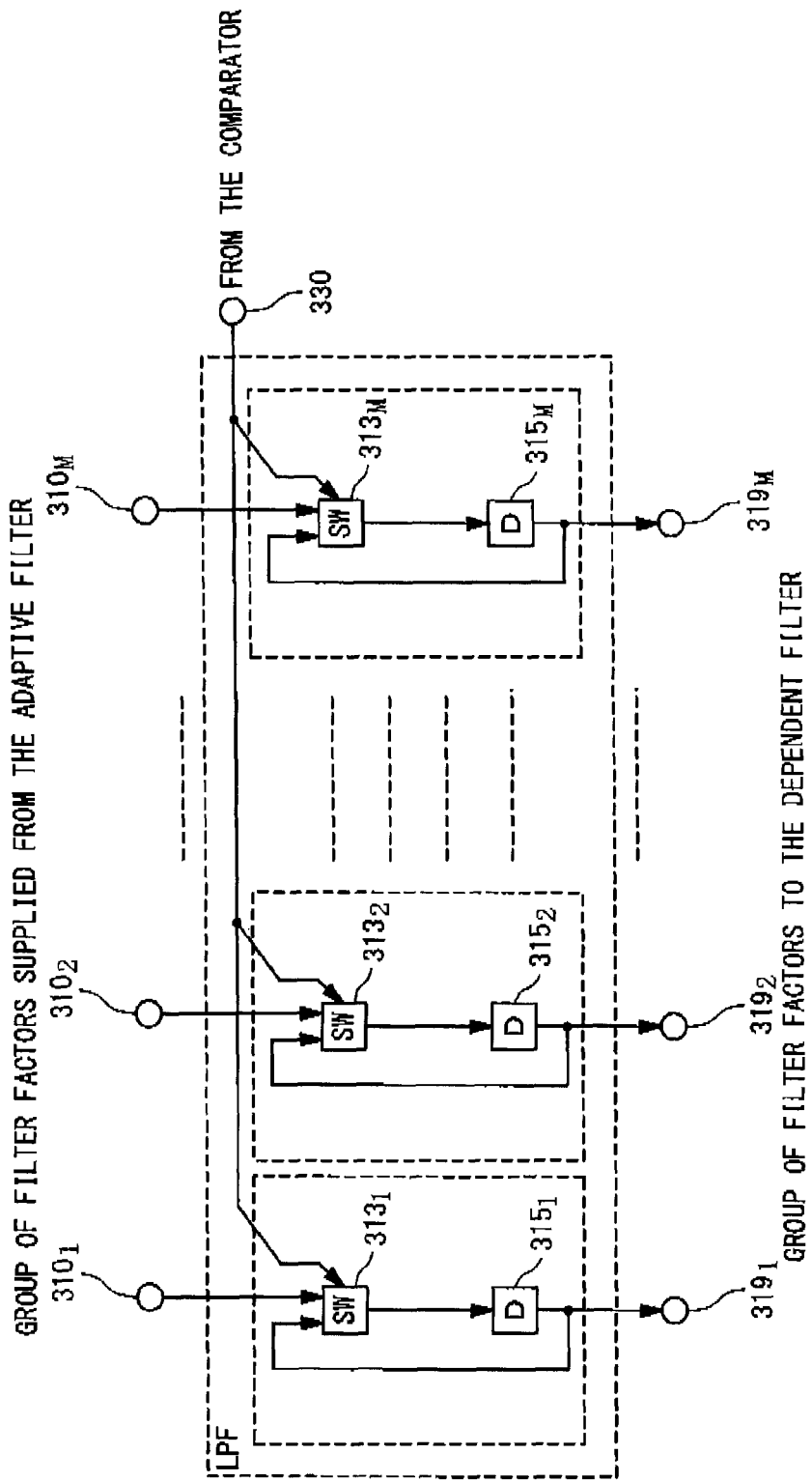
FIG. 15 is a block diagram showing a configuration example of a filter factor copy control part.
Figure 16:
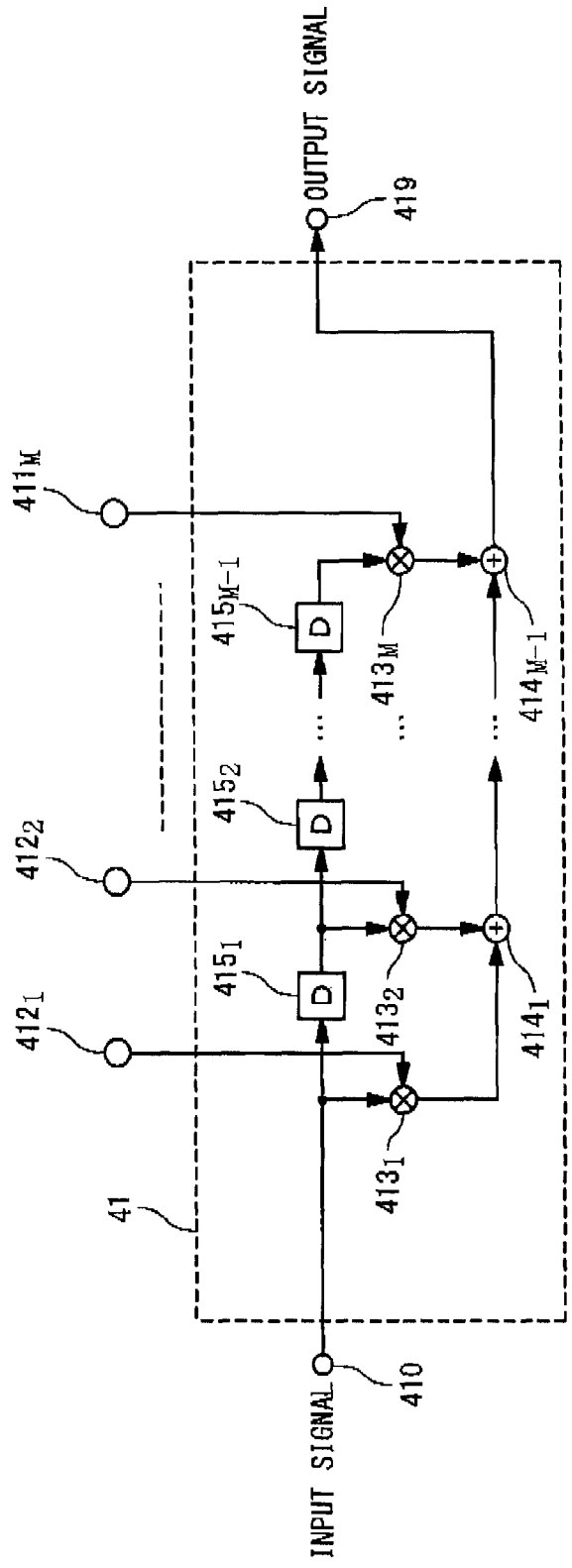
FIG. 16 is a block diagram showing a configuration example of a dependent filter.
Figure 18:
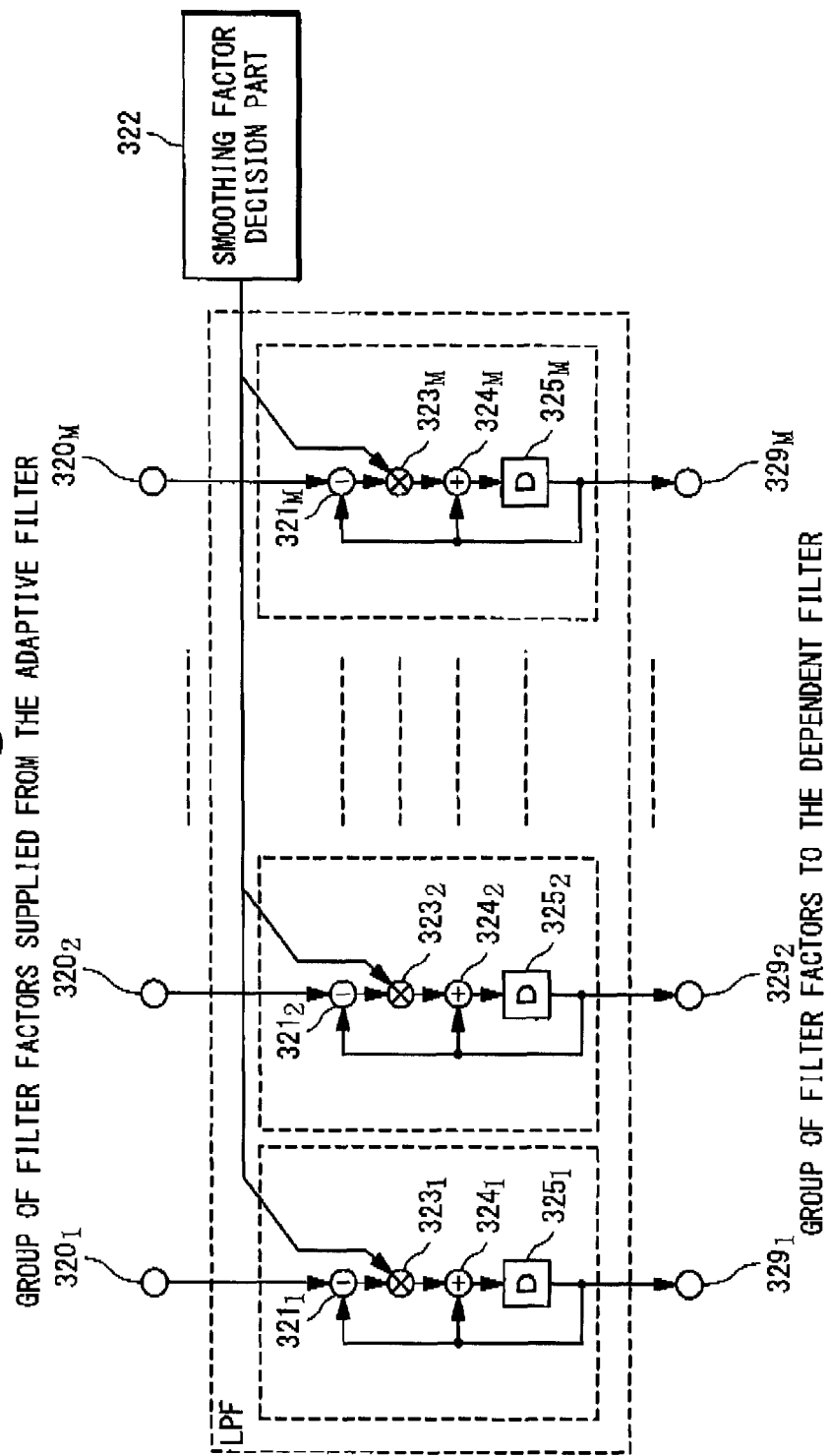
FIG. 18 is a block diagram showing a configuration example of a filter factor smoothing part.
Figure 19:
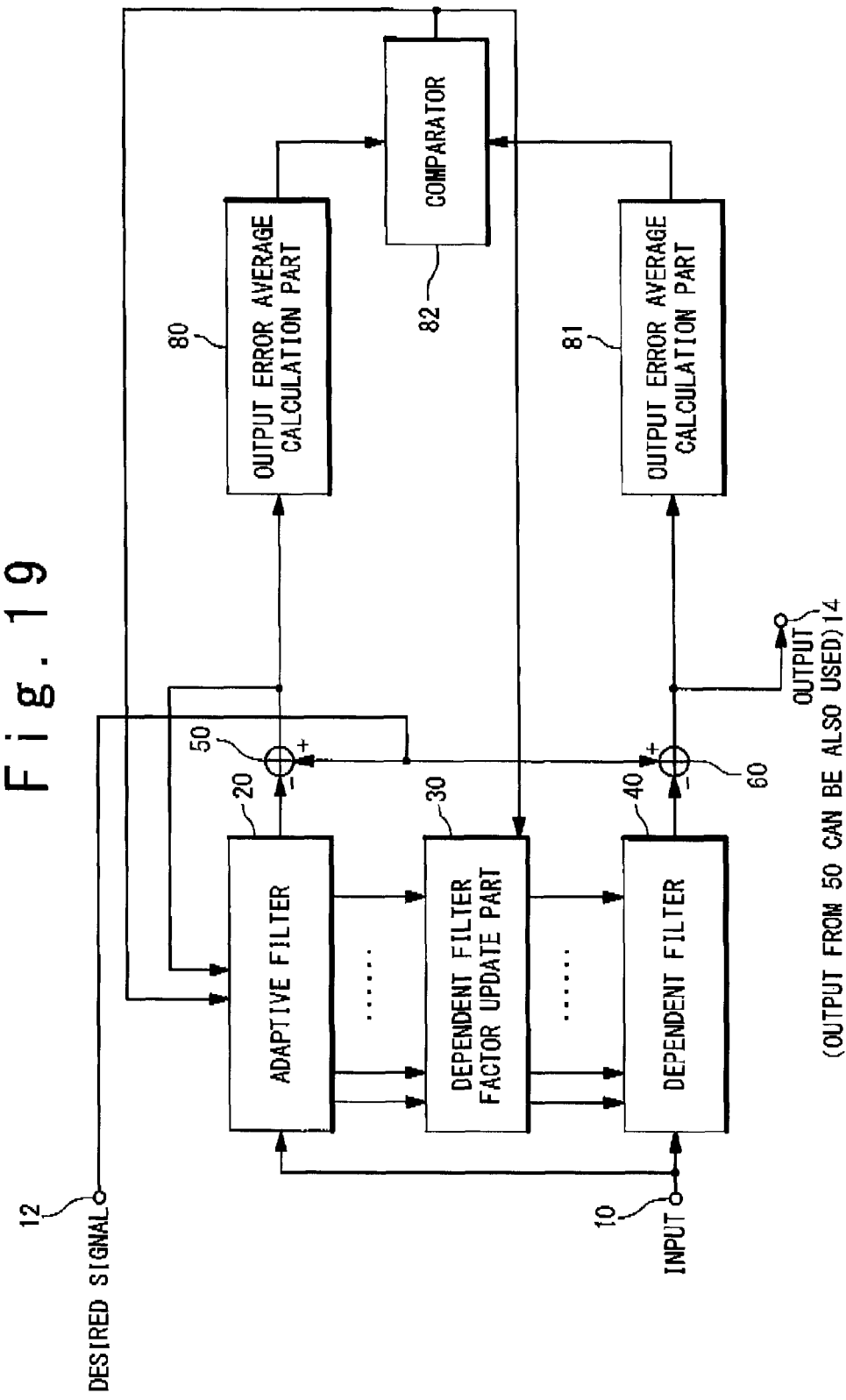
FIG. 19 is a block diagram showing related techniques of the present invention.

In the configuration elements shown in FIG. 1, configuration elements other than the low-frequency cutoff filter 70 and the low-frequency cutoff filter 71 are the same as those in the related techniques described referring to FIG. 19. Accordingly, for example, the adaptive filter 20 can be realized by the configuration as shown in FIG. 14 and the dependent filter 40 can be realized by the configuration as shown in FIG. 16. As in the related techniques, the dependent filter factor update part 30 can be realized with the filter factor copy control part in FIG. 15 or the filter factor smoothing part in FIG. 18. Details thereof will be described later. The low-frequency cutoff filter 70 and the low-frequency cutoff filter 71 has the same configuration and may be realized by circuits as shown in FIG. 3A to FIG. 3C, for example.

Figure 3A:
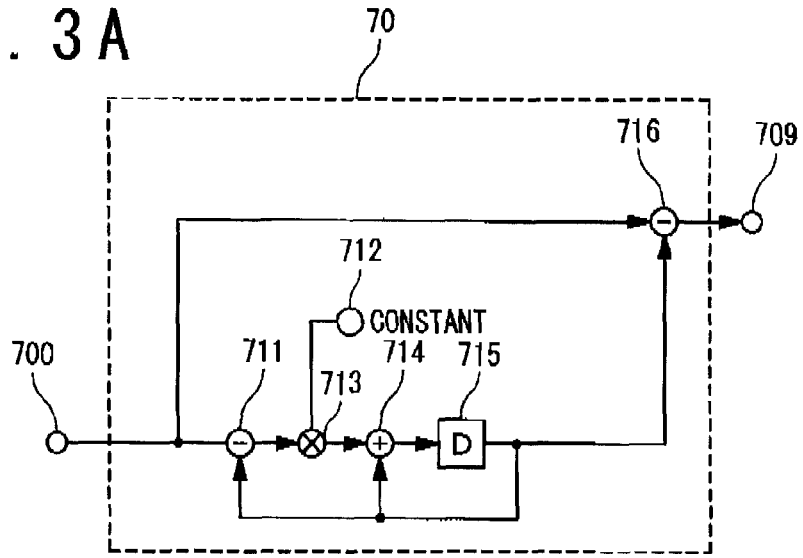
FIG. 3A is a block diagram showing a configuration example of a low-frequency cutoff filter.
Figure 3B:
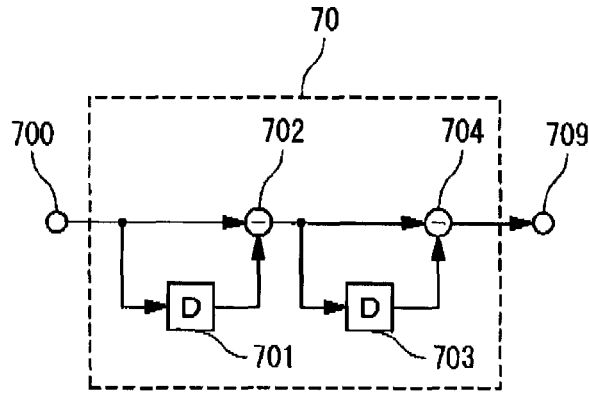
FIG. 3B is a block diagram showing a configuration example of the low-frequency cutoff filter.
Figure 3C:
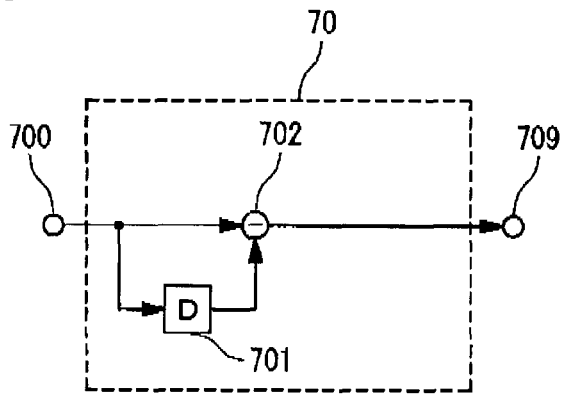
FIG. 3C is a block diagram showing a configuration example of the low-frequency cutoff filter.

FIG. 3C shows a configuration example for realizing the low-frequency cutoff filter by using a primary FIR filter. The output error imputed through a terminal 700 is supplied to a delay generator 701 and a subtracter 702. The delay generator 701 delays a signal supplied from the terminal 700 by 1, sample and supplies the delayed signal to the subtracter 702. The subtracter 702 subtracts the delayed signal supplied from the delay generator 701 from the signal supplied from the terminal 700 and outputs the result through a terminal 709. This output result is sent to an output error calculation part 80 (or 81).

In FIG. 3B, more acute low-frequency cutoff is achieved by connecting two primary FIR filters in cascade.

In FIG. 3A, the low-frequency cutoff filter is realized with a primary IIR filter. The output error inputted through a terminal 700 is supplied to a subtracter 711 and a subtracter 716. The subtracter 711 subtracts a signal supplied from a delay generator 715 from the signal supplied from the terminal 700 and sends a result to a multiplier 713. The multiplier 713 multiplies the signal received from the subtracter 711 by a constant supplied through a terminal 712 and sends a result to an adder 714. The adder 714 adds a signal from the multiplier 713 to a signal from the delay generator 715 and sends a result to the delay generator 715. The delay generator 715 delays a signal received from the adder 714 by 1 sample and sends the delayed signal to the subtracter 716. The subtracter 716 subtracts the signal received from the delay generator 715 from the signal received through the terminal 700 and outputs a result through the output terminal 709. This output result is sent to the output error calculation part 80 (or 81).

The configuration examples shown in FIGS. 3A to 3C are the low-frequency cutoff filter which cutoff DC components and can be used as the low-frequency cutoff filters 70, 71 in the present exemplary embodiment. Any filter other than the configuration examples shown in FIGS. 3A to 3C can be used as the low-frequency cutoff filters 70, 71 as long as it has a characteristic to cut off or reduce low frequencies. The low-frequency cutoff characteristic varies depending on the configuration of the filter to be used, and the configuration of the filter for achieving a suitable characteristic can be selected according to a level of the low-frequency in the observation noise.

Next, effects of the present exemplary embodiment will be described.

In the present exemplary embodiment, even though the observation noise is mixed into the desired signal, the unidentified system (the echo path existing between the terminal 10 and the terminal 12) can be accurately identified. The reason is as follows. Since low-frequency components in the observation noise, which have strong autocorrelation and contribute heavily to the false operation, are removed from the error signals of the subtracter 50 and the subtracter 60 by the low-frequency cutoff filter 70 and the low-frequency cutoff filter 71 and the output error averages are obtained by remained signals, the probability that the convergence state of the adaptive filter 20 is wrongly determined can be reduced, and therefore, accurate system identification can be achieved.

When components in the observation noise mixed in the terminal 12 are removed by the low-frequency cutoff filter or the band cutoff filter which is provided between the terminal 12 and the subtracters 50 or 60 in order to reduce an adverse effect of the observation noise, a signal obtained after removing low-frequency components from the desired signal becomes substantial desired signal, and thus, system identification of the echo path itself becomes difficult. However, in the present exemplary embodiment, since the low-frequency components are removed from the signal for calculating the output error averages of the subtracter 50 and the subtracter 60, such a problem does not occur.

Next, specific examples of the first exemplary embodiment of the present invention will be described referring to drawings.

Figure 2:
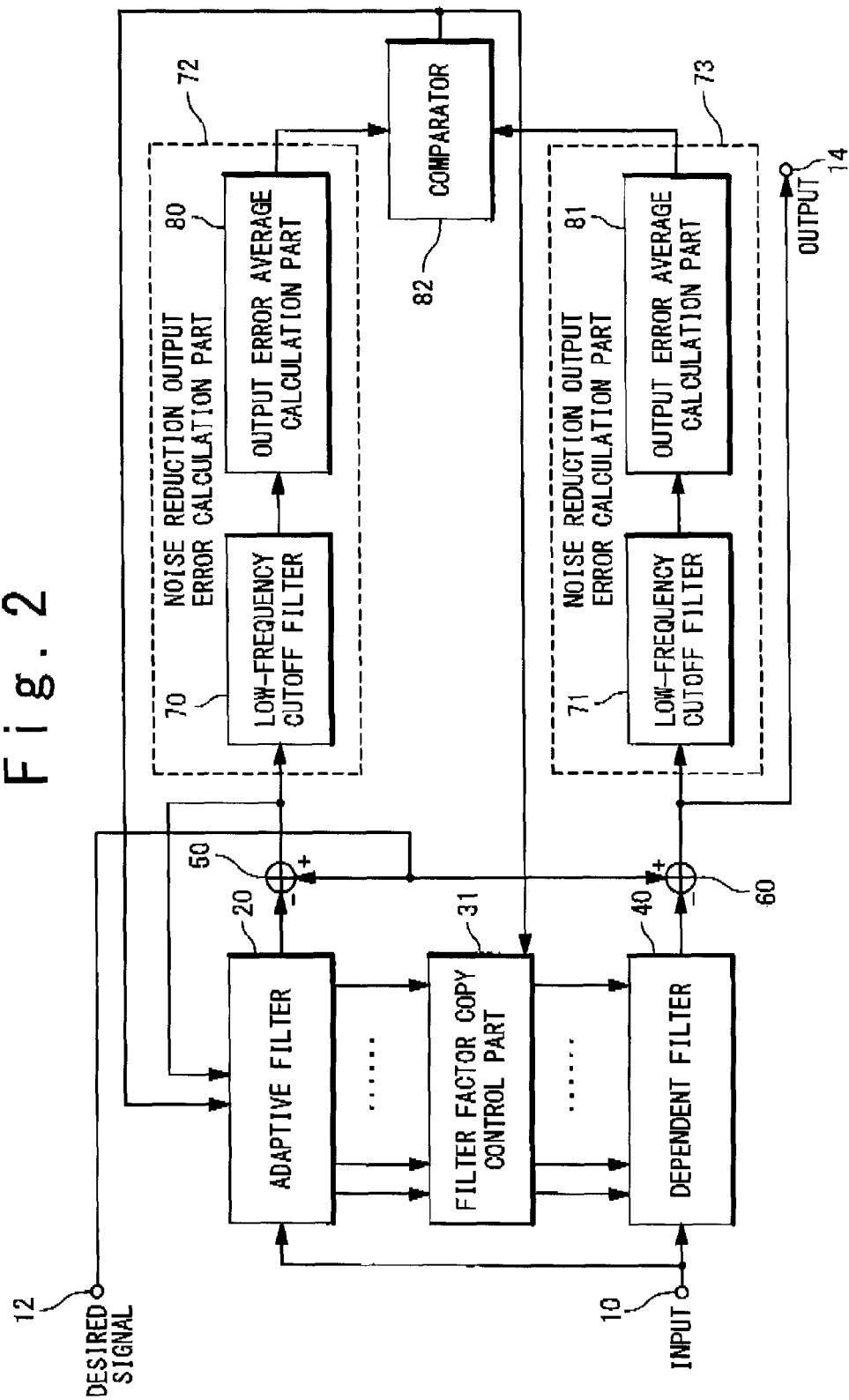
FIG. 2 is a block diagram showing a first exemplary embodiment of the present invention.

FIG. 2 shows a configuration in the first exemplary embodiment of the present invention in a case where the filter factor copy control part 31 is used as the dependent filter factor update part 30 in FIG. 1. The filter factor copy control part 31 is realized by the configuration shown in FIG. 15, for example.

Figure 13:
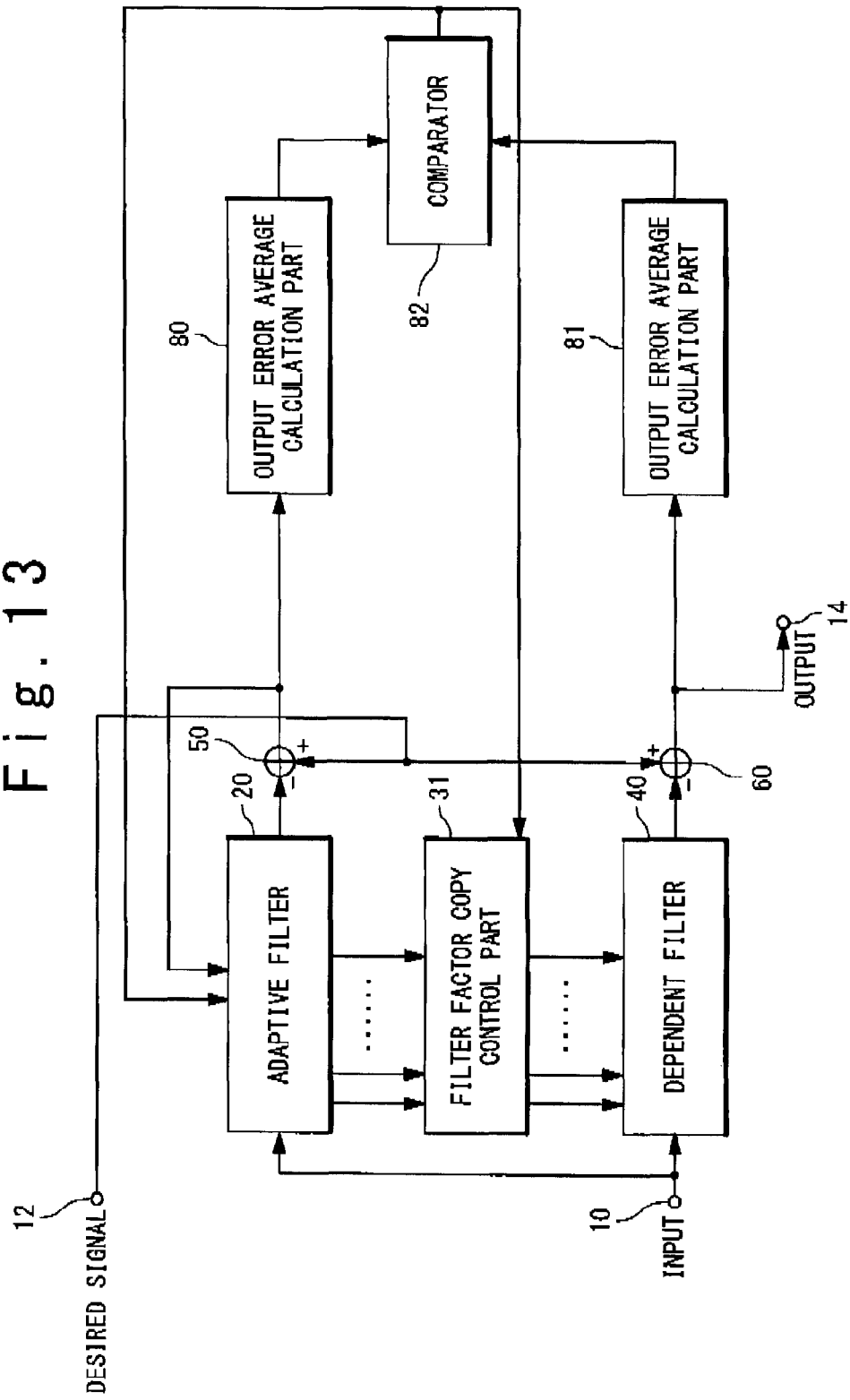
FIG. 13 is a block diagram showing a configuration of a related technique of the present invention.

A configuration in the present exemplary embodiment in FIG. 2 is different from the configuration in the related technique FIG. 13 in that the low-frequency cutoff filter 70 and the low-frequency cutoff filter 71 are inserted into previous stages of the output error average calculation part 80 and the output error average calculation part 81, respectively.

By using the low-frequency cutoff filter 70 and the low-frequency cutoff filter 71, the effect of the observation error in the output error can be greatly reduced, more accurate convergence state determination can be achieved, and more desirable control in the adaptive filter 20 and the filter factor copy control part 31 can be performed.

Figure 4:
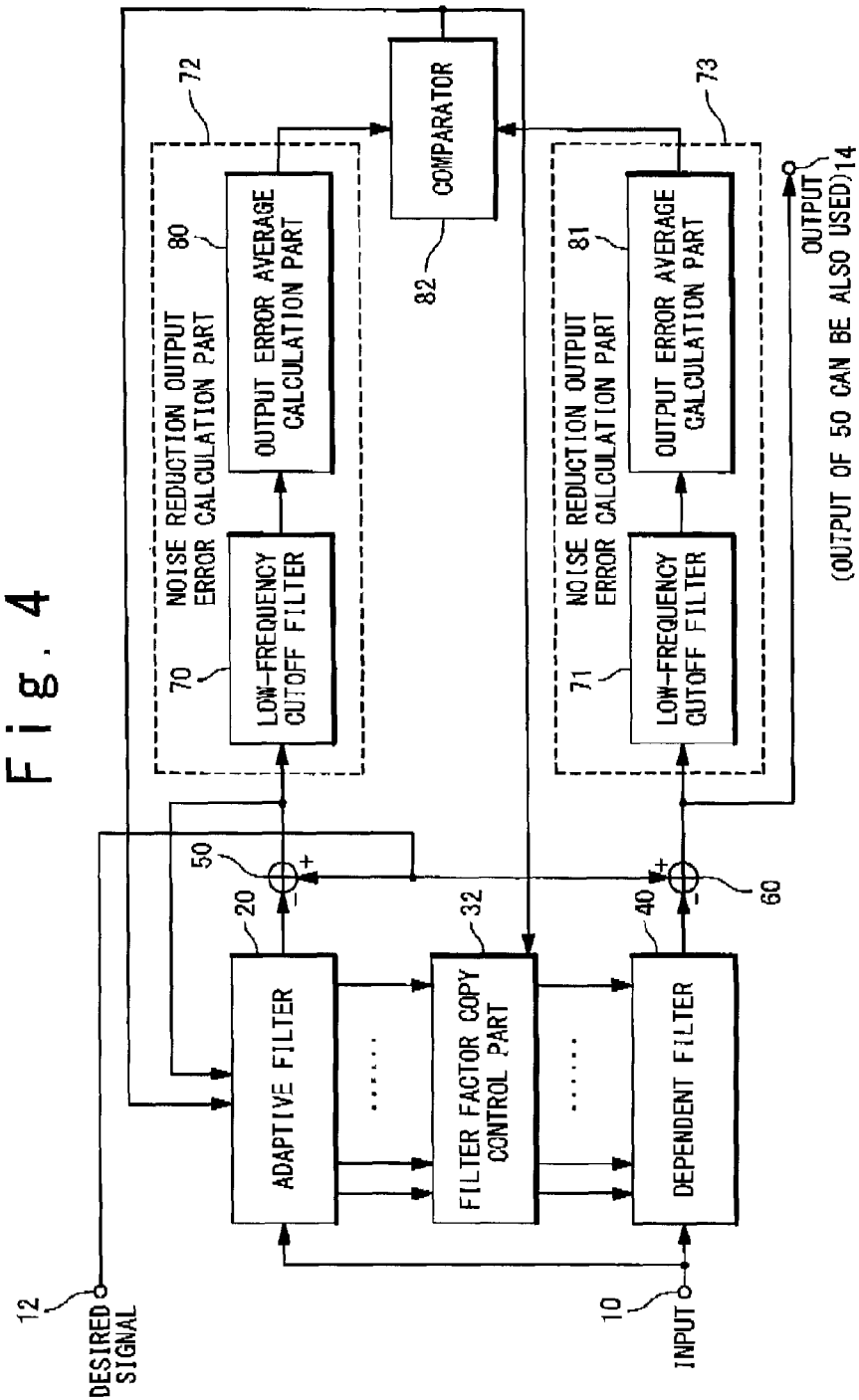
FIG. 4 is a block diagram showing the first exemplary embodiment of the present invention.

FIG. 4 shows a configuration in a case where the filter factor smoothing part 32 is used as the dependent filter factor update part 30 in FIG. 1 in the first exemplary embodiment of the present invention. The filter factor smoothing part 32 is realized by the configuration as shown in FIG. 18, for example.

Figure 17:
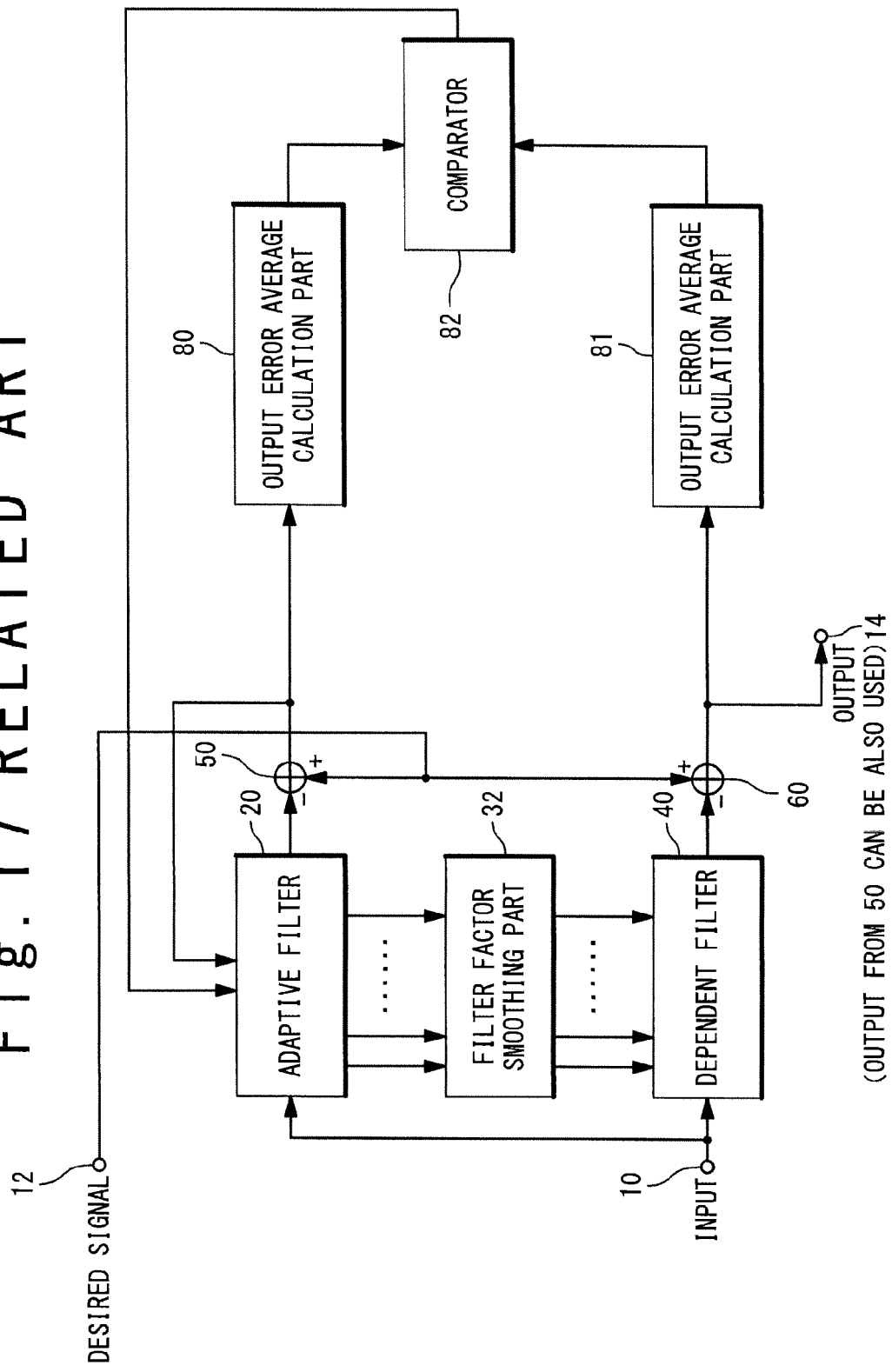
FIG. 17 is a block diagram showing a configuration of another related technique of the present invention.

The configuration in the present exemplary embodiment in FIG. 4 is different from the configuration in the related technique FIG. 17 in that the low-frequency cutoff filter 70 and the low-frequency cutoff filter 71 are inserted into previous stages of the output error average calculation part 80 and the output error average calculation part 81, respectively. The effect obtained by this difference is the same as in the configuration in the exemplary embodiment in FIG. 2, that is, the convergence state can be determined more accurately and more desirable control in the adaptive filter 20 can be performed.

Figure 5:
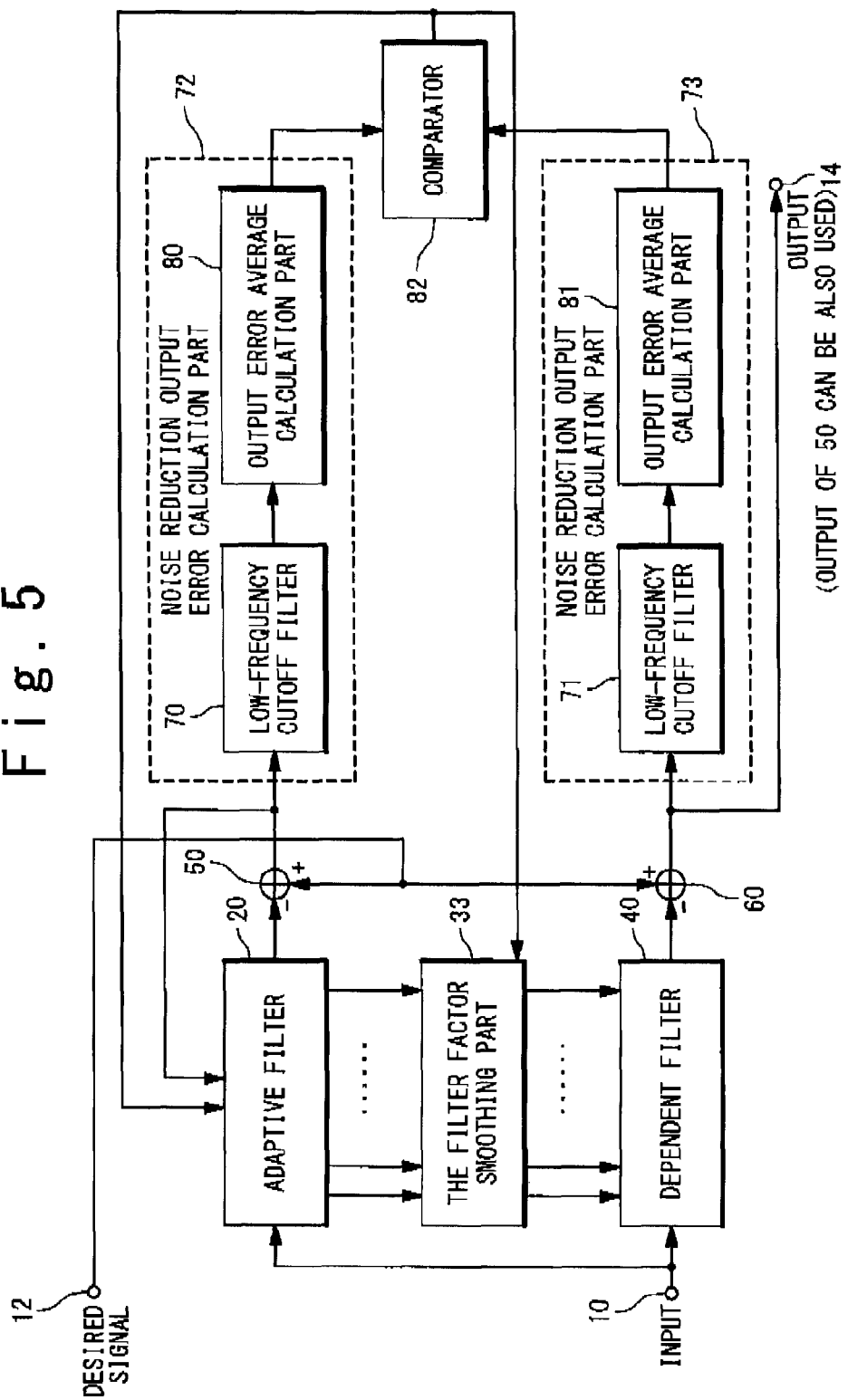
FIG. 5 is a block diagram showing the first exemplary embodiment of the present invention.

FIG. 5 shows a configuration in a case where the filter factor smoothing part 32 is replaced with a filter factor smoothing part 33 in the present exemplary embodiment. Further, in the configuration shown in FIG. 5, the determination result of the comparator 82 is also supplied to the filter factor smoothing part 33.

The filter factor smoothing part 33 is different from the filter factor smoothing part 32 having a smoothing factor as a time-invariant constant in that its smoothing factor is time-varying controlled by the determination result supplied from the comparator 82.

Figure 6:
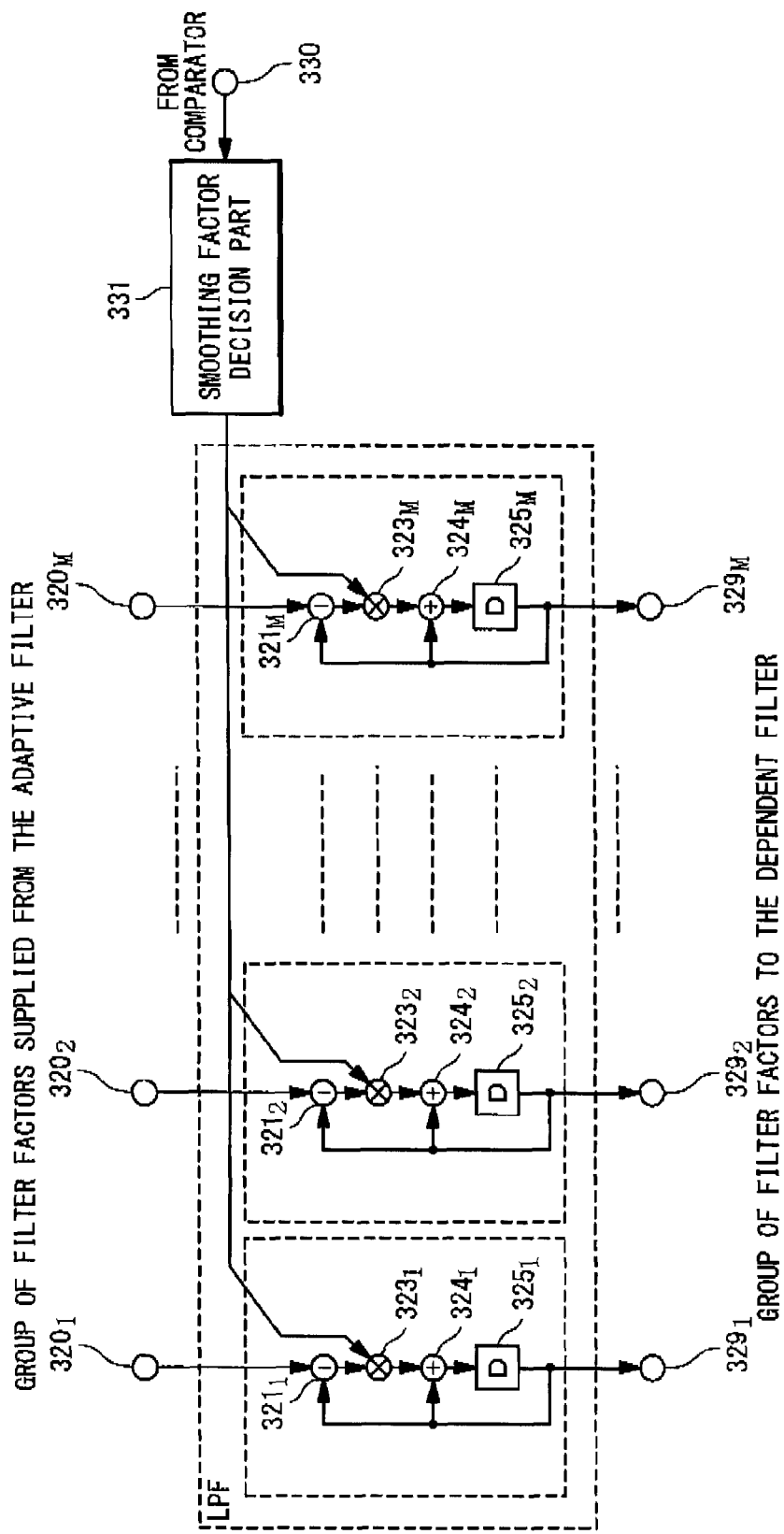
FIG. 6 is a block diagram showing a configuration example of a filter factor smoothing part.

FIG. 6 shows a configuration example of the filter factor smoothing part 33. The configuration example is different from the configuration example of the filter factor smoothing part 32 shown in FIG. 18 in that a smoothing factor decision part 322 is replaced with a smoothing factor decision part 331.

The smoothing factor decision part 331 has a function to vary the smoothing factor to be supplied to the multiplier 323m, on the basis of the determination result supplied from the comparator 82 through a terminal 330. Specifically, when the determination result of the comparator 82 shows that the adaptive filter 20 is converging, the smoothing factor decision part 331 outputs a relatively large smoothing factor. As a result, the time constant of smoothing is decreased, and the filter factor of the dependent filter 40 rapidly follows the filter factor of the adaptive filter 20. On the other hand, when the determination result of the comparator 82 shows that the adaptive filter 20 has converged and the observation noise is dominant in the output error, the smoothing factor decision part 331 outputs a small smoothing factor. As a result, the time constant of smoothing increases, and a factor obtained by suppressing disturbance of the filter factor of the adaptive filter 20 due to the observation noise is supplied to the dependent filter 40.

Even when the smoothing factor is controlled, determination of the convergence state is important. By reducing the probability of false determination by application of the present invention, the dependent filter 40 can precisely perform system identification.

Also in the above-mentioned exemplary embodiment, by using the low-frequency cutoff filter 70 and the low-frequency cutoff filter 71, the effect of the observation error in the output error can be greatly reduced to precisely determine the convergence state, and more desirable control in the adaptive filter 20 and the filter factor smoothing part 33 can be performed.

Figure 7:
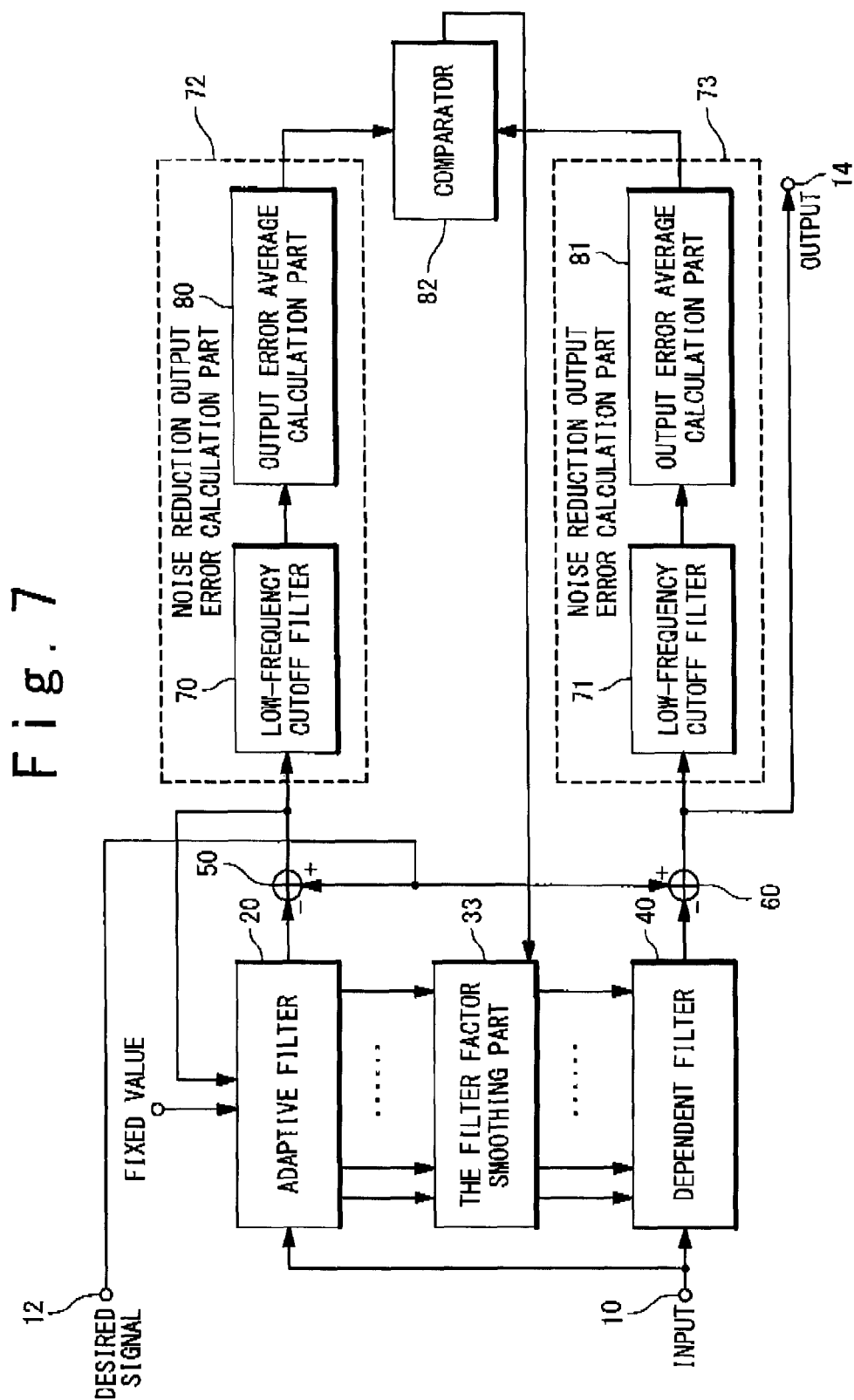
FIG. 7 is a block diagram showing the first exemplary embodiment of the present invention.

FIG. 7 shows a configuration in a case where a fixed value is used in place of the determination result supplied from the comparator 82 to the adaptive filter 20 in the present exemplary embodiment.

Since the adaptive filter 20 has the configuration shown in FIG. 14, for example, the fixed value in place of the determination result of the comparator 82 is supplied to the step size calculation part 222 through the terminal 202 and therefore, the step size is constant at all times.

In the present exemplary embodiment, the step size of the adaptive filter 20 is constant. Specifically, when the determination result of the comparator 82 shows that the adaptive filter 20 is converging, the filter factor smoothing part 33 uses a relatively large smoothing factor. Thus, even when the step size of the adaptive filter 20 is constant, the filter factor of the dependent filter 40 follows the filter factor of the adaptive filter 20 relatively rapidly. On the other hand, when the determination result of the comparator 82 shows that the adaptive filter 20 has converged and the observation noise is dominant in the output error, the filter factor smoothing part 33 uses a small smoothing factor. Thus, even when the step size of the adaptive filter 20 is constant, the factor obtained by suppressing the disturbance of the filter factor of the adaptive filter 20 due to the observation noise can be supplied to the dependent filter 40.

As described above, even if the step size of the adaptive filter 20 is not controlled, accurate system identification can be achieved by controlling the smoothing factor of the filter factor smoothing part 33 according to the convergence state of the adaptive filter 20. Furthermore, by using the low-frequency cutoff filter 70 and the low-frequency cutoff filter 71, the effect of the observation error in the output error can be greatly reduced, the convergence state can be determined more accurately, and more desirable control in the filter factor smoothing part 33 can be performed.

Figure 8:
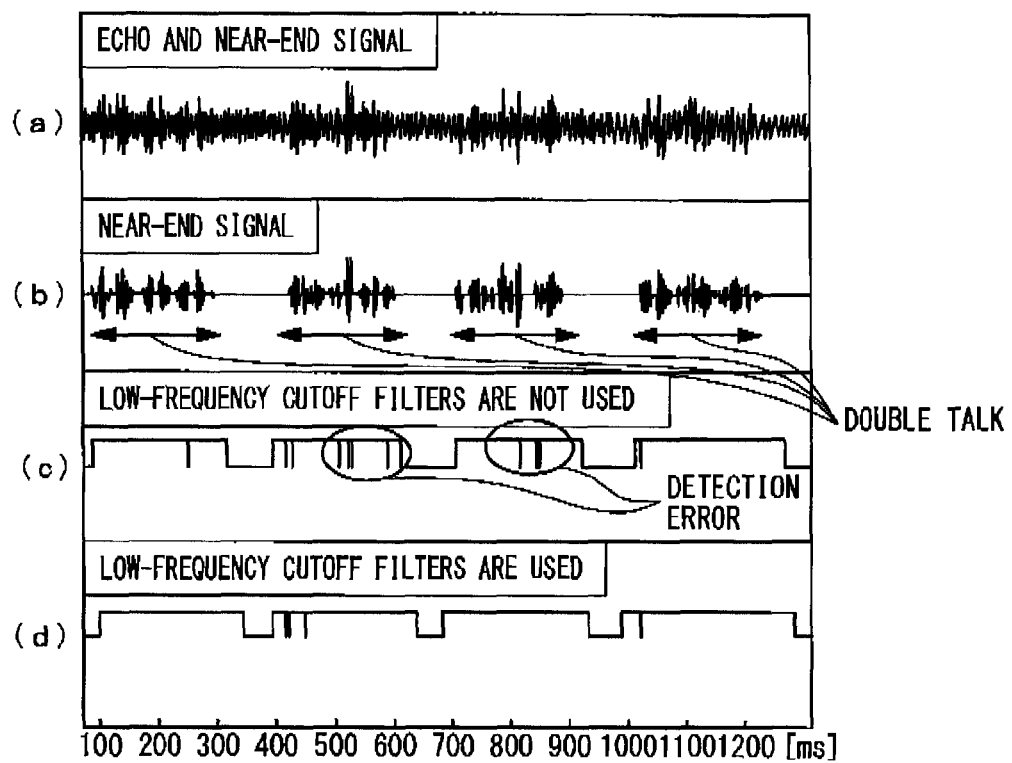
FIG. 8 is an example showing a simulation experiment result which shows an effect of first exemplary embodiment of the present invention.

FIG. 8 shows an example of a simulation experiment result, which demonstrates effects of the present exemplary embodiment. A state (a) of FIG. 8 shows a waveform of a microphone signal containing the echo and the near-end signal, that is, the desired signal. White noise is used as the far-end signal as a source of echo, and a voice signal is used as the near-end voice. A state (b) of FIG. 8 shows a waveform of the near-end signal contained in the signal shown in the state (a) of FIG. 8. Ideally, it should be determined that sections expressed as "double talk" are sections where "double talk", that is, the near-end signal is dominant. A state (c) of FIG. 8 shows the determination result of the comparator 82 in binary in a case where the low-frequency cutoff filters 70, 71 are not used in FIG. 7. An upper value means determination of double talk, that is, after convergence, and a lower value means determination of during convergence. As partially surrounded by ellipses, many detection errors occur.

On the contrary, a state (d) of FIG. 8 shows a determination result of the comparator 82 in a case where the low-frequency cutoff filters 70, 71 are used in FIG. 7. It can be understood that the use of the low-frequency cutoff filters 70, 71 can reduce the number of detection errors and realize more accurate control.

This exemplary embodiment shows that, even when the step size of the adaptive filter 20 is not controlled based on the determination result of the comparator 82, accurate system identification can be achieved by controlling the smoothing factor of the filter factor smoothing part 33 based on the determination result of the comparator 82. Therefore, the step size of the adaptive filter 20 is not necessarily a fixed value and may be a variable value controlled by any method other than a method using determination result of the comparator 82.

[Second Exemplary Embodiment]

The present invention can be applied to a case using the learning identification method, the projection algorithm or the RLS algorithm other than the LMS algorithm, as the adaptive algorithm of the adaptive filter 20. When the RLS algorithm is used as the adaptive algorithm of the adaptive filter 20, the step size and/or a parameter called as a forgetting factor may be used as a target of control. When the projection algorithm is used as the adaptive algorithm, the step size may be controlled as in the case of using the LMS algorithm. In both cases, the probability that the convergence state is wrongly determined can be reduced by application of the present invention, enabling desirable control. It is apparent that suitable algorithms other than the above-mentioned algorithms may be used as the adaptive algorithm.

Figure 9:
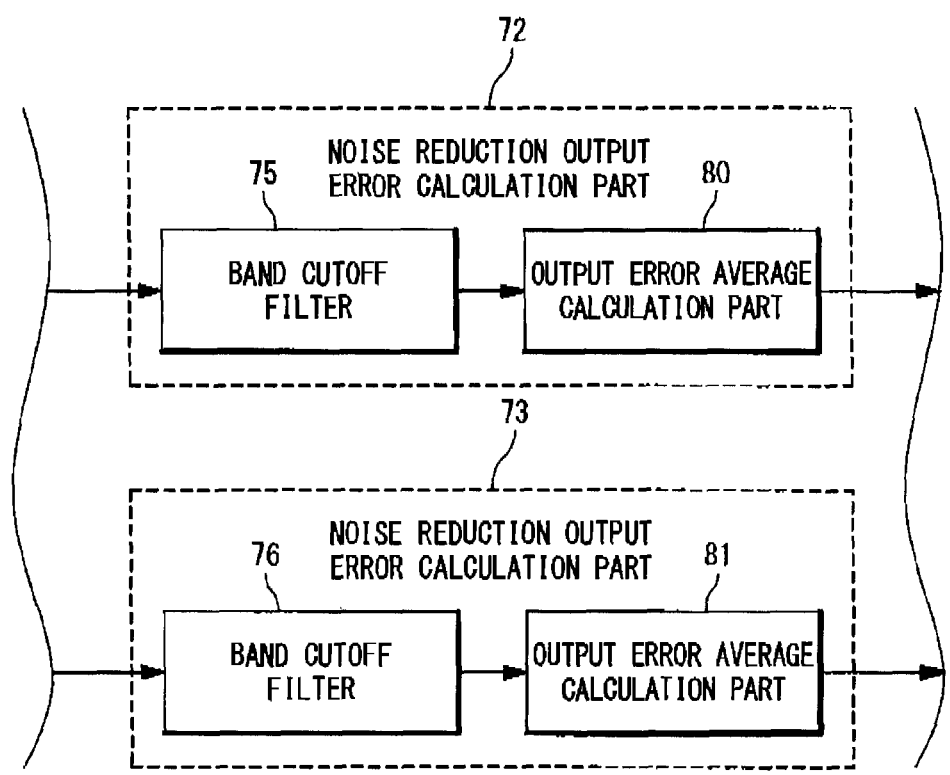
FIG. 9 is a block diagram showing another configuration example of a noise reduction output error calculation part.

In the first exemplary embodiment, the case where components in the observation noise which contribute to the false operation are low-frequency components or unknown is described. However, when the frequency components in the observation noise which contribute to the false operation can be limited, as shown in FIG. 9, the low-frequency cutoff filters 70, 71 can be replaced with band cutoff filters 75, 76. The band cutoff filters 75, 76 used herein may be designed to cut off the components in the observation noise which contribute to the false operation and pass components in the input signal. When the components in the observation noise which contribute to the false operation exist over a plurality of specific frequency bands, the band cutoff filters 75, 76 may be designed to cutoff a plurality of bands. Since the components in the observation noise which contribute to the false operation are cut off, as in the first exemplary embodiment, the probability that the convergence state is wrongly determined can be reduced and thus, system identification with higher accuracy can be achieved. Since only the components of the observation noise is cut off, as compared to the case where the whole of the low-frequency band is cut off by the low-frequency cutoff filters 70, 71, the components in the original input signal remains much, and therefore, the convergence state can be determined more accurately.

In the above-mentioned exemplary embodiments, although the noise reduction output error calculation part 72 (73), which obtains the output error by reducing the components of the observation noise contributing to the false operation, includes the low-frequency cutoff filter 70 (71) and the output error average calculation part 80 (81), another configuration may be employed.

Figure 10:
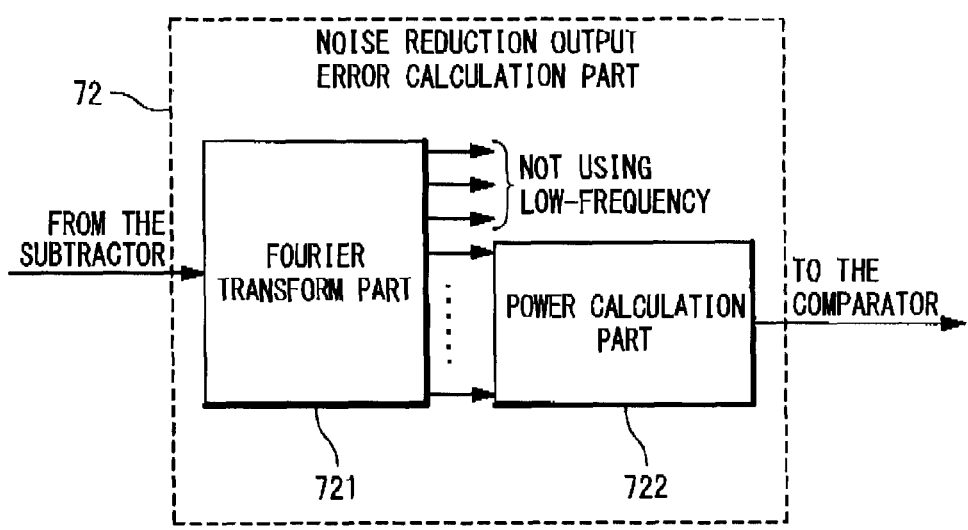
FIG. 10 is a block diagram showing another configuration example of the noise reduction output error calculation part.

FIG. 10 is a block diagram showing another configuration example of the noise reduction output error calculation part 72. As shown in FIG. 10, the noise reduction output error calculation part 72 includes a Fourier transform part 721 and a power calculation part 722. The Fourier transform part 721 converts the signal received from the subtracter 50 into a frequency domain signal and output frequency components. Frequency components, which are obtained by removing the frequency components of the observation noise which contribute to the false operation, are supplied to the power calculation part 722. FIG. 10 shows a case where the frequency components of the observation noise which contribute to the false operation are low-frequency components, and the frequency components other than the low-frequency components are supplied to the power calculation part 722. The power calculation part 722 calculates a sum of power of the supplied frequency components and sends the calculated sum of power to the comparator 82.

Here, noting the sum of power outputted from the power calculation part 722, the sum of power shows power of the frequency components obtained by removing the frequency components of the observation noise which contribute to the false operation and becomes an output error average in which the components of the observation noise contributing to the false operation are reduced, as in the output error average outputted from the noise reduction output error calculation part 72 in FIG. 1. Accordingly, also when the noise reduction output error calculation part 72 has the configuration shown in FIG. 10, the convergence state can be determined more accurately, resulting in that more desirable control can be performed in the adaptive filter 20 or the dependent filter 40.

It is apparent that when the Fourier transform part 721 in the noise reduction output error calculation part 72 is replaced with a block for conversion into a domain corresponding to frequency, such as cosine transform or wavelet transform, the same effect can be obtained. Furthermore, it is apparent that when the power calculation part 722 is not configured to calculate the power and is configured to calculate an absolute sum and the like, the same effect can be obtained.

[Third Exemplary Embodiment]

Figure 11:
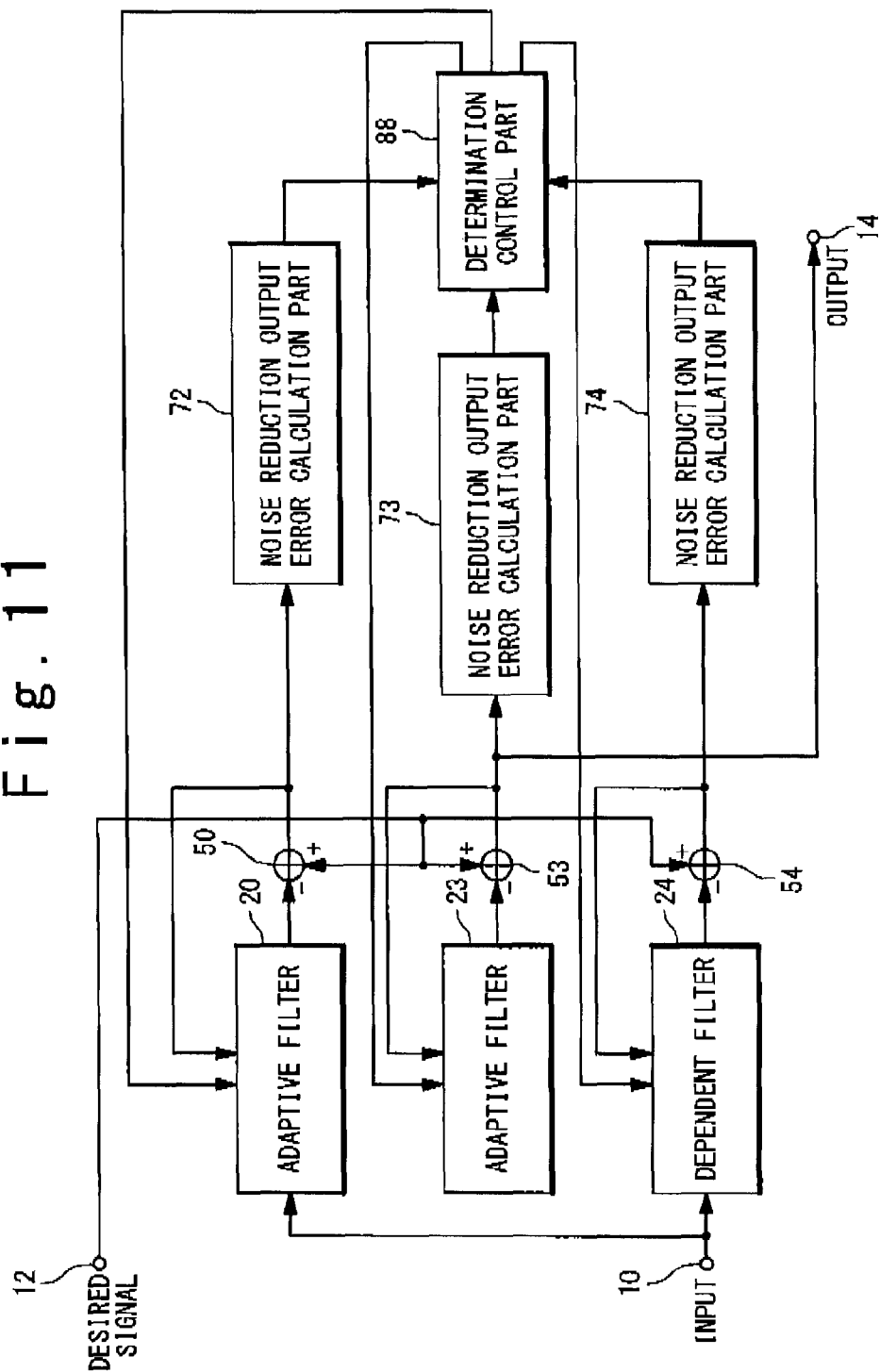
FIG. 11 is a block diagram showing another exemplary embodiment of the present invention.

Although the configurations using the two filters of the adaptive filter 20 and the dependent filter 40 are described in the above-mentioned exemplary embodiments, the present invention can be also applied to a case where system identification is performed by three or more filters. FIG. 11 is a block diagram of an exemplary embodiment for performing system identification by use of three adaptive filters.

In a third exemplary embodiment, the three adaptive filters 20, 23, 24 which are different from one another in step size are used, and the step sizes of the three adaptive filters 20, 23, 24 are controlled based on a result of comparison between output error averages with reduced effect of the observation noise on the adaptive filters. The each configuration of the adaptive filters 23, 24 is the same as that of the adaptive filter 20, and these filters are configured as shown in FIG. 14, for example. Concerning magnitude correlation of the step sizes of the adaptive filters 20, 23, 24, for example, the step size of the adaptive filter 20 is minimum, the step size of the adaptive filter 23 is medium and the step size of the adaptive filter 24 is maximum.

Figure 12:
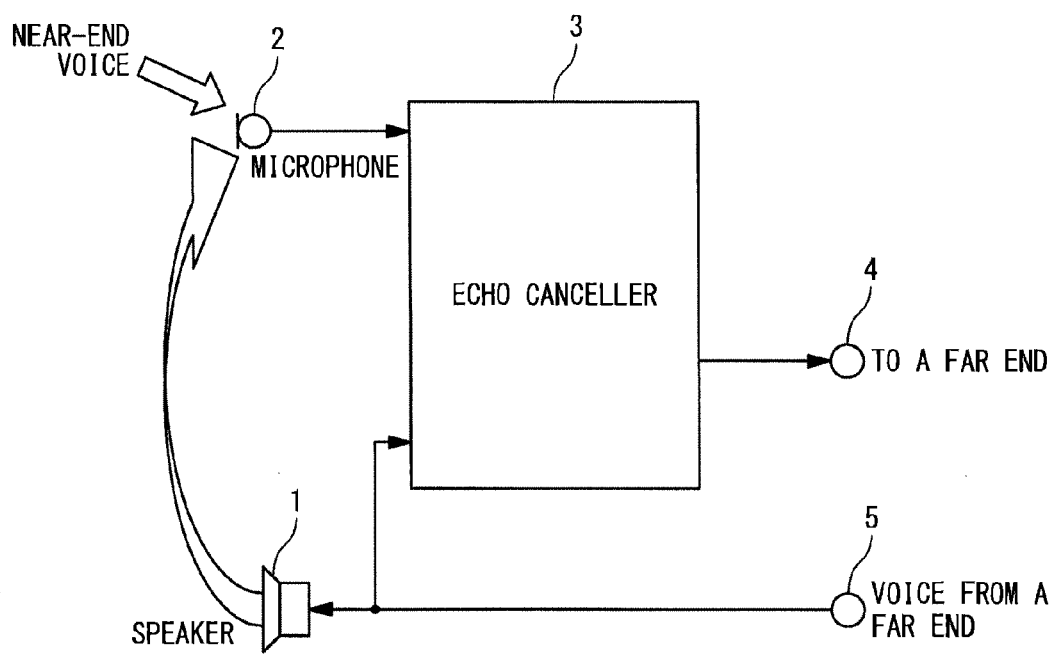
FIG. 12 is a block diagram showing a configuration of an echo canceller.

Output signals of the adaptive filters 20, 23, 24 are sent to the respective subtracters 50, 53, 54. The subtracters 50, 53, 54 receive the output signals of the respective adaptive filters 20, 23, 24 and the desired signal inputted from the terminal 12, that is, the microphone signal in FIG. 12, calculate differences therebetween and output the differences. The output results are supplied to the respective noise reduction output error calculation parts 72, 73, 74. The configuration of the noise reduction output error calculation part 74 is the same as that of the each of noise reduction output error calculation parts 72, 73. The noise reduction output error calculation parts 72, 73, 74 receive signals from the respective subtracters 50, 53, 54, reduce the components of the observation noise which contribute to the false operation to calculate the output error averages, and send the output error averages to a determination control part 88. The determination control part 88 receives the output error averages in which the components of the observation noise contributing to the false operation is reduced, determines magnitude correlation of the output error averages, and sends a signal for controlling the step size to the adaptive filters 20, 23, 24. For example, the step size is controlled so that the output error from the adaptive filter 23, that is, the output error average from the noise reduction output error calculation part 73 becomes smaller than the other two output error averages, At this time, magnitude correlation of the step sizes is maintained.

Specifically, since it is desired that the step size is large when the output error average of the adaptive filter 20 is smaller than the output error averages of the other two adaptive filters 23, 24, the step size of each filter is increased. Conversely, since it is desired that the step size is small when the output error average of the adaptive filter 24 is smaller than the output error averages of the other two adaptive filters 20, 23, the step size of each filter is decreased. When the output error average of the adaptive filter 23 is smaller than the output error averages of the other two adaptive filters 20, 24, the step size of each filter is not changed, since the step sizes of the three filters have already fallen within a suitable range.

Through the above-mentioned control of the step size, the step sizes of the three filters are suitably controlled, and an output signal, in which an echo is sufficiently suppressed, is outputted through the output terminal 14. Also in the present exemplary embodiment, since the components of the observation noise which contribute to the false operation are reduced in the signal inputted to the determination control part 88, the probability that the convergence state is wrongly determined can be reduced, and thus, desirable step size control can be performed.

Although the echo canceller is used as an example in the above-mentioned exemplary embodiments, the present invention can be applied to applications of the adaptive filter such as a noise canceller, a howling canceller, an adaptive equalizer and an adaptive microphone array for system identification. Also, if an imperative is minimization of the output error average, the present invention can be applied to an application of the adaptive filer other than identification of an unidentified system, such as an adaptive array.

Features of the system identification device in the above-mentioned exemplary embodiment are summarized as follows. The above-mentioned system. identification device includes a plurality of adaptive filters or dependent filters for minimization of the output errors, the adaptive filters or the dependent filters are controlled based on the output errors of the adaptive filters or the dependent filters, the components of the observation noise which contribute to the false operation is reduced in the output errors, and the control is carried out based on a result of comparison between the output errors after the reduction.

In the above-mentioned system identification device, the step size of the adaptive filter or the filter factor modification algorithm is employed as a target of control. In order to reduce the components of the observation noise which contribute to the false operation, the low-frequency cutoff filter is used. Further, in order to reduce the components of the observation, noise which contribute to the false operation, the band cutoff filter is used. The filter factor of the dependent filter is updated by copying the filter factor of the adaptive filter on the basis of the comparison result. The filter factor of the dependent filter is updated by smoothing the filter factor of the adaptive filter on the basis of the comparison result.

In the above-mentioned system identification device, the adaptive filter controls the step size on the basis of the comparison result by using the LMS algorithm which can control the step size. The adaptive filter controls the step size on the basis of the comparison result by using the projection algorithm which can control the step size. The adaptive filter controls the step size or the forgetting factor on the basis of the comparison result by using the RLS algorithm which can control the step size or the forgetting factor.

Those skilled in the art could easily implement various modifications of the above exemplary embodiments. Therefore, the present invention is not limited to the above exemplary embodiments and can be interpreted in the possible widest scope considered based on claims and their equivalents. This application claims priority based on Japanese Patent Application No. 2007-243329, filed on Sep. 20, 2007, and the whole disclosure is incorporated herein.

The invention claimed is:

1. A system identification device, which identifies an unidentified system provided between a first input terminal and a second input terminal, comprising:
an adaptive filter and a dependent filter having a system identified filter factor, in which a signal supplied from said first input terminal is inputted;
a dependent filter factor update part configured to update a filter factor of said dependent filter based on a filter factor of said adaptive filter;
a first subtracter configured to subtract an output signal of said adaptive filter from a signal supplied from said second input terminal;
a first output error average calculation part configured to calculate a first output error average based on an output signal of said first subtracter;
a second subtracter configured to subtract an output signal of said dependent filter from said signal supplied from said second input terminal;
a second output error average calculation part configured to calculate a second output error average based on an output signal of said second subtracter; and
a comparator configured to compare said first output error average and said second output error average,
wherein said first output error average calculation part reduces at least a part of band components overlapping frequency bands of an observation noise, which is applied to said second input terminal, in frequency bands of said output signal of said first subtracter, and calculates said first output error average based on components remained after reducing,
said second output error average calculation part reduces at least a part of band components overlapping frequency bands of an observation noise, which is applied to said second input terminal, in frequency bands of said output signal of said second subtracter, and calculates said second output error average based on components remained after reducing, and
at least either updating said filter factor of said adaptive filter by said output signal of said first subtracter or updating said filter factor of said dependent filter by said dependent filter factor update part is controlled based on a comparison result of said comparator.

2. The system identification device according to claim 1, wherein said first output error average calculation part and said second output error average calculation part reduce low-frequency components in said output signals of said first subtracter and said second subtracter.

3. The system identification device according to claim 1, wherein said dependent filter factor update part updates said filter factor of said dependent filter, by copying said filter factor of adaptive factor to said dependent filter, and
an availability of copying is controlled based on a comparison result of said comparator.

4. The system identification device according to claim 1, wherein said dependent filter factor update part updates said filter factor of said dependent filter, by smoothing said filter factor of adaptive filter and setting in said dependent filter, and
a smoothing factor of updating is controlled based on a comparison result of said comparator.

5. The system identification device according to claim 1, wherein a step size of said adaptive filter is controlled, when said filter factor of said adaptive filter is controlled to be updated by said output signal of said first subtracter.

6. A system identification device, which identifies an unidentified system provided between a first input terminal and a second input terminal, comprising:
a first adaptive filter in which a signal supplied from said first input terminal is inputted;
a second adaptive filter configured to carry out system identification, in which said signal supplied from said first input terminal is inputted;
a third adaptive filter in which said signal supplied from said first input terminal is inputted;

a first subtracter configured to subtract an output signal of said first adaptive filter from a signal supplied from said second input terminal;

a first output error average calculation part configured to calculate a first output error average based on an output signal of said first subtracter;

a second subtracter configured to subtract an output signal of said second adaptive filter from said signal supplied from second input terminal;

a second output error average calculation part configured to calculate a second output error average based on an output signal of said second subtracter;

a third subtracter configured to subtract an output signal of said third adaptive filter from said signal supplied from second input terminal;

a third output error average calculation part configured to calculate third output error average based on an output signal of said third subtracter; and a determination control part configured to compare said first output error average, said second output error average, and said third output error average, wherein said first output error average calculation part reduces at least a part of band components overlapping frequency bands of an observation noise, which is applied to said second input terminal, in frequency bands of said output signal of said first subtracter, and calculates said first output error average based on components remained after reducing, said second output error average calculation part reduces at least a part of band components overlapping frequency bands of an observation noise, which is applied to said second input terminal, in frequency bands of said output signal of said second subtracter and calculates said second output error average based on components remained after reducing, said third output error average calculation part reduces at least a part of band components overlapping frequency bands of an observation noise, which is applied to said second input terminal, in frequency bands of said output signal of said third subtracter and calculates said third output error average based on components remained after reducing, and at least one of updating said filter factor of said adaptive filter by said output signal of said first subtracter, updating said filter factor of said adaptive filter by said output signal of said second subtracter, and updating said filter factor of said adaptive filter by said output signal of said third subtracter is controlled based on a comparison result of said determination control part.

7. A system identification method for identifying an unidentified system provided between a first input terminal and a second input terminal, comprising:

inputting a signal supplied from said first input terminal into an adaptive filter and a dependent filter which has a system identified filter factor;

updating a filter factor of said dependent filter based on a filter factor of said adaptive filter;

generating first output signal by subtracting an output signal of said adaptive filter from a signal supplied from said second input terminal;

calculating a first output error average based on said first output signal;

generating a second output signal, by subtracting an output signal of said dependent filter from said signal supplied from said second input terminal;

calculating a second output error average based on said second output signal; and comparing said first output error average and said second output error average, wherein said calculating said first output error average includes, reducing at least a part of band components overlapping frequency bands of an observation noise, which is applied to said second input terminal, in frequency bands of said first output signal, and calculating said first output error average based on components remained after said reducing, said calculating said second output error average includes, reducing at least a part of band components overlapping frequency bands of an observation noise, which is applied to said second input terminal, in frequency bands of said second output signal, and calculating said second output error average based on components remained after said reducing, and further comprising, controlling at least either updating said filter factor of the adaptive filter by said output signal of said first subtracter or updating said filter factor of said dependent filter by said dependent filter factor update part, based on a comparison result of a comparator.

8. The system identification method according to claim 7, wherein said calculating first output error average and said calculating second output error average include reducing low-frequency components in said first output signal and said second output signal.

9. The system identification method according to claim 7, further comprising;

updating said filter factor of said dependent filter by copying said filter factor of adaptive factor to said dependent filter, and controlling an availability of said copying in a case of copying said filter factor of said adaptive filter to said dependent filter, based on a comparison result of said comparator.

10. The system identification method according to claim 7, further comprising;

updating said filter factor of said dependent filter, by smoothing said filter factor of adaptive filter to set in said dependent filter, wherein said smoothing includes, controlling a smoothing factor in a case of smoothing said filter factor of adaptive filter, based on a comparison result of said comparator.

11. The system identification method according to claim 7, wherein said controlling updating said filter factor of the adaptive filter by said output signal of said first subtracter includes, controlling a step size of said adaptive filter.

12. A system identification method for identifying an unidentified system provided between a first input terminal and a second input terminal, comprising:

inputting a signal supplied from said first input terminal into a first adaptive filter;

inputting said signal supplied from said first input terminal into a second adaptive filter which carries out system identification;

inputting said signal supplied from said first input terminal into a third adaptive filter;

subtracting an output signal of said first adaptive filter from a signal supplied from said second input terminal, by using a first subtracter;

calculating a first output error average based on an output signal of said first subtracter, by using a first output error average calculation part;

subtracting an output signal of said second adaptive filter from said signal supplied from said second input terminal, by using a second subtracter;

calculating a second output error average based on an output signal of said second subtracter, by using a second output error average calculation part;

subtracting an output signal of said third adaptive filter from said signal supplied from said second input terminal, by using a third subtracter;

calculating a third output error average based on an output signal of said third subtracter, by using third output error average calculation part; and comparing said first output error average and said second output error average, by using a determination control part, wherein said calculating said first output error average includes, reducing at least a part of band components overlapping frequency bands of an observation noise, which is applied to said second input terminal, in frequency bands of said output signal of said first subtracter, and calculating said first output error average based on components which are remained after reducing, said calculating said second output error average includes, reducing at least a part of band components overlapping frequency bands of an observation noise, which is applied to said second input terminal, in frequency bands of said output signal of said second subtracter, and calculating said second output error average based on components which are remained after reducing, said calculating said third output error average includes, reducing at least a part of band components overlapping frequency bands of an observation noise, which is applied to said second input terminal, in frequency bands of said output signal of said third subtracter, and calculating said third output error average based on components which are remained after reducing, and further comprising, controlling at least one of updating said filter factor of said adaptive filter by said first subtracter, updating said filter factor of said adaptive filter by said second subtracter, and updating said filter factor of said adaptive filter by said third subtracter, based on a comparison result of said determination control part.

\* \* \* \* \*